(12) United States Patent
Hidaka

(10) Patent No.: US 6,903,963 B2
(45) Date of Patent: Jun. 7, 2005

(54) THIN-FILM MAGNETIC MEMORY DEVICE EXECUTING DATA WRITING WITH DATA WRITE MAGNETIC FIELDS IN TWO DIRECTIONS

(75) Inventor: Hideto Hidaka, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/134,523

(22) Filed: Apr. 30, 2002

(65) Prior Publication Data

US 2003/0090933 A1 May 15, 2003

(30) Foreign Application Priority Data

Nov. 13, 2001 (JP) ......................................... 2001-347098

(51) Int. Cl.⁷ .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS 6,215,707 B1 * 4/2001 Moyer ......................... 365/171
6,317,376 B1 * 11/2001 Tran et al. ................... 365/158

OTHER PUBLICATIONS

Hideto Hidaka, "Thin Film Magnetic Memory Device Capable Of Reducing Number Of Wires And Reading Data at High Speed" U.S. patent application No. 09/834,638, filed Apr. 16, 2001.

Hideto Hidaka "Thin Film Magnetic Memory Device Having A Magnetic Tunnel Junction" U.S. patent application No. 09/982,936, filed Oct. 22, 2001.

Scheuerlein, et al. "A 10ns Read and Write Non–Volatile Memory Array Using a Magnetic Tunnel Junction and FET Switch in Each Cell" ISSCC Digest of Technical Paper, TA7.2, Feb. 8, 2000, pp. 94–95, 128–129 and 409–410.

Durlam, et al, "Nonvolatile RAM Based on Magnetic Tunnel Junction Elements" ISSCC Digest of Technical Papers, TA7.3, Feb. 8, 2000, pp. 96–97, 130–131 and 410–411.

Naji, et al, "A 256kb 3.0V 1T1MTJ Nonvolatile Magnetoresistive RAM" ISSCC Digest of Technical Papers, TA7.6, Feb. 6, 2001, pp. 94–95, 122–123, 404–405 and 438.

* cited by examiner

Primary Examiner—Huan Hoang
(74) Attorney, Agent, or Firm—McDermott Will & Emery LLP

(57) ABSTRACT

A tunneling magneto-resistance element forming an MTJ memory cell has an elongated form having an aspect ratio larger than one for stabilizing the magnetization characteristics. Bit lines and write word lines for carrying data write currents are arranged along short and long sides of the tunneling magneto-resistance element, respectively. The data write current flowing through the bit line, which can easily have an interconnection width, is designed to be larger than the data write current flowing through the write word line. For example, a distance between the write word line and the tunneling magneto-resistance element is smaller than a distance between the bit line and the tunneling magneto-resistance element.

19 Claims, 23 Drawing Sheets

THIN-FILM MAGNETIC MEMORY DEVICE EXECUTING DATA WRITING WITH DATA WRITE MAGNETIC FIELDS IN TWO DIRECTIONS

BACKGROUND OF THE INVENTION

The present invention relates to a thin-film magnetic memory device, and particularly to a random access memory provided with memory cells having MTJs (magnetic tunnel junctions)

DESCRIPTION OF THE BACKGROUND ART

Attention is being given to an MRAM Magnetic Random Access Memory) device as a memory device, which can nonvolatilely store data with a low power consumption. The MRAM device is a memory device, in which a plurality of thin-film magnetic elements are formed in a semiconductor integrated circuit for nonvolatilely storing data, and random access to each thin-film magnetic elements is allowed.

Particularly, in recent years, it has been announced that a performance of the MRAM device can be dramatically improved by using the thin-film magnetic members, which utilize the MTJs (magnetic tunnel junctions), as memory cells. The MRAM device with memory cells having the magnetic tunnel junctions has been disclosed in technical references such as "A 10 ns Read and Write Non-Volatile Memory Array Using a Magnetic Tunnel Junction and FET Switch in Each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers,. TA7.6, February 2001.

FIG. 26 conceptually shows a structure of a memory cell, which has a magnetic tunnel junction, and may be merely referred to as an "MTJ memory cell" hereinafter.

Referring to FIG. 26, a MTJ memory cell includes a tunneling magneto-resistance element TMR having an electric resistance, which is variable in accordance with a level of storage data, and an access element ATR for forming a path of a sense current Is passing through tunneling magneto-resistance element TMR in a data read operation. Access element ATR is typically formed of a field-effect transistor, and therefore may be referred to as an "access transistor ATR" hereinafter. Access transistor ATR is coupled between tunneling magneto-resistance element TMR and a fixed voltage (ground voltage Vss).

For the MTJ memory cell, the structure includes a write word line WWL for instructing data writing, a read word line RWL for executing data reading and a bit line BL, which is a data line for transmitting an electric signal in accordance with the data level of the storage data.

FIG. 27 conceptually shows an operation of reading data from the MTJ memory cell.

Referring to FIG. 27, tunneling magneto-resistance element TMR has a ferromagnetic layer, which has a fixed and uniform magnetization direction, and may be merely referred to as a "fixed magnetic layer" hereinafter, and a ferromagnetic layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunnel junction.

In the data read operation, access transistor ATR is turned on in response to activation of read word line RWL. Thereby, sense current Is can flow through a current path formed of bit line BL, tunneling magneto-resistance element TMR, access transistor ATR and ground voltage Vss.

Tunneling magneto-resistance element TMR has an electric resistance, which is variable depending on a correlation in magnetization direction between fixed magnetic layer FL and free magnetic layer VL. More specifically, when the fixed magnetic layer FL and free magnetic layer VL are magnetized in the same (parallel) direction, the electric resistance of tunneling magneto-resistance element TMR is smaller than that in the case where these layers FL and VL are magnetized in the opposite directions (non-parallel), respectively.

Accordingly, by magnetizing free magnetic layer VL in a direction depending on the storage data, the voltage change caused in tunneling magneto-resistance element TMR by sense current Is changes depending on the storage data level. For example, if sense current Is is passed through tunneling magneto-resistance element TMR after precharging bit line BL to a predetermined voltage, the storage data of the MTJ memory cell can be read out by detecting the voltage on bit line BL.

FIG. 28 conceptually shows an operation of writing data in the MTJ memory cell.

Referring to FIG. 28, read word line RWL is inactive, and access transistor ATR is off in the data write operation. In this state, the data write currents for magnetizing free magnetic layer VL in the direction depending on the level of the write data are supplied to write word line WWL and bit line BL, respectively. The magnetization direction of free magnetic layer VL depends on the respective data write currents flowing through write word line WWL and bit line BL.

FIG. 29 conceptually shows a relationship between the data write current and the magnetization direction of the tunneling magneto-resistance element in the data write operation for the MTJ memory cell.

Referring to FIG. 29, an abscissa H(EA) gives a magnetic field, which is applied in a easy axis (EA) to free magnetic layer VL of tunneling magneto-resistance element TMR. An ordinate H(HA) indicates a magnetic field acting in a hard axis (HA) on free magnetic layer VL. Magnetic fields H(EA) and H(HA) correspond to two magnetic fields produced by currents flowing through bit line BL and write word line WWL, respectively.

In the MTJ memory cell, the fixed magnetization direction of fixed magnetic layer FL is along the easy axis of free magnetic layer VL, and free magnetic layer VL is magnetized along the easy axis direction, and particularly in the same parallel direction, which is the same direction as fixed magnetic layer FL, or in the opposite parallel direction, which is opposite to the above direction, depending on the level ("1" or "0") of the storage data. In the following description, the electric resistances of tunneling magneto-resistance element TMR, which correspond to the two magnetization directions of free magnetic layer VL, are indicated by R1 and R0 (R1>R0), respectively. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 29. Therefore, the magnetization direction of free magnetic layer VL does not change when the data write magnetic fields applied thereto have intensities corresponding to a region inside the asteroid characteristic line.

As can be seen from the asteroid characteristic line, the magnetization threshold required for changing the magnetization direction along the magnetization easy axis can be lowered by applying the magnetic field in the direction of the hard axis to free magnetic layer VL.

When the operation point in the data write operation is designed, for example, as shown in FIG. 29, the data write magnetic field in the MTJ cell selected as a data write target is designed such that the data write magnetic field in the direction of the easy axis has an intensity of $H_{WR}$. Thus, the data write current flowing through bit line BL or write word line WWL is designed to take a value, which can provide the data write magnetic field of $H_{WR}$. In general, data write magnetic field $H_{WR}$ is represented by a sum of a switching magnetic field $H_{SW}$ required for switching the magnetization direction and a margin $\Delta H$. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through write word line WWL and bit line BL. Thereby, free magnetic layer VL in tunneling magneto-resistance element TMR is magnetized in the same parallel direction as fixed magnetic layer FL or opposite parallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

As described above, the electric resistance of tunneling magneto-resistance element TMR is variable in accordance with the magnetization direction, which is rewritable by the data write magnetic field applied thereto. Therefore, non-volatile data storage can be executed by establishing a correlation between two magnetization directions of free magnetic layer VL in tunneling magneto-resistance element TMR and levels ("1" and "0") of the storage data.

The references described before have disclosed technologies for integrating such MTJ memory cells on a semiconductor substrate to provide an MRAM device, which is a random access memory.

FIG. 30 conceptually shows a structure of a memory array formed of MTJ memory cells arranged in rows and columns.

Referring to FIG. 30, MTJ memory cells arranged in rows and columns can provide a MRAM device of a high density. FIG. 30 shows the MTJ memory cells arranged in n rows and m columns (n, m: natural numbers). For the (n×m) MTJ memory cells arranged in rows and columns, the device is provided with write word lines WWL1–WWLn of n in number and read word lines RWL1–RWLn of n in number as well as bit lines BL1–BLm of m in number. When the data write current flows in the data write operation, write word lines WWL1–WWLn are arranged in the row direction, and bit lines BL1–BLm are arranged in the column direction.

However, it is desired for stabilizing the magnetic characteristics that the tunneling magneto-resistance element used as the MTJ memory cell has an elongated form having an aspect ratio (length-to-width ratio) larger than one. Accordingly, the form of tunneling magneto-resistance element TMR and the arrangement of the interconnection groups (write word lines and bit lines) for passing the data write currents must be designed to match with each other. Otherwise, a current density of these interconnection groups increases to cause a factor such as electro-migration, which impedes operation reliability of the MRAM device.

In the operation of writing data into the MTJ memory cell, and thus rewriting the magnetization direction of the tunneling magneto-resistance element, the data write magnetic fields in the two directions are applied as already described with reference to FIG. 29. If the data write magnetic field does not appropriately change with time, therefore, the magnetizing operation may become unstable, and a malfunction may occur.

In a so-called "page mode operation" performed for increasing an operation speed of a Dynamic Random Access Memory (DRAM), a plurality of column addresses are continuously and randomly accessed without changing the row selection. For applying a similar page mode operation to the MRAM, therefore, it is necessary to design the device with consideration given to the data write characteristics of the MTJ memory cells already described.

SUMMARY OF THE INVENTION

An object of the invention is to provide a thin-film magnetic memory device, which matches with a form of an MTJ memory cell having stable magnetization characteristics, and operates stably.

Another object of the invention is to provide a structure of a thin-film magnetic memory device, which can stably and rapidly perform a page mode operation.

A thin-film magnetic memory device according to the invention includes a plurality of memory cells each having a magnetic memory portion having an electric resistance varying in accordance with a magnetization direction rewritable in response to application of a predetermined data write magnetic field caused by first and second data write currents; a first data write interconnection arranged in a first direction for passing the first data write current; and a second data write interconnection arranged in a second direction for passing the second data write current. The first data write current is larger than the second data write current, and the first data write interconnection has a sectional area larger than a sectional area of the second data write interconnection.

Preferably, the first and second data write interconnections are arranged such that a distance between the first data write interconnection and the magnetic memory portion is longer than a distance between the second data write interconnection and the magnetic memory portion.

Preferably, the first data write interconnection has an interconnection width larger than that of the second data write interconnection.

Preferably, the first data write interconnection has an interconnection thickness larger than that of the second data write interconnection.

In the thin-film magnetic memory device described above, the data write interconnections for producing the data write magnetic fields can be arranged to prevent such a situation that a current density of one kind of the interconnections increases to impair operation reliability.

Preferably, each of the magnetic memory portions has a form having an aspect ratio larger than one between a long side and a short side. The first data write interconnection has an interconnection width in the direction of the long side, and the second data write interconnection has an interconnection width in the direction of the short side smaller than that of the first data write interconnection.

Therefore, the device can employ the magnetic memory portion having a form designed to provide stable magnetization characteristics, and further the interconnection groups for passing the data write currents can be arranged efficiently without lowering the operation reliability and increasing a memory array area.

More preferably, the second data write interconnection is arranged using a metal interconnection layer at a higher level than the first data write interconnection.

Thereby, the structure can be easily applied to a memory device of a logic embedded type such as a system LSI (Large Scale Integrated circuit).

According to another aspect of the invention, a thin-film magnetic memory device includes a plurality of memory cells each having a magnetic memory portion having an electric resistance varying in accordance with a magnetization direction rewritable in response to application of a data write magnetic field; a first data write interconnection for passing a first data write current producing the data write magnetic field along a easy axis; and a second data write interconnection for passing a second data write current producing the data write magnetic field along a hard axis. The first data write current has a rising time constant larger than a rising time constant of the second data write current at a start of a data write operation performed by rewriting a magnetization direction of the magnetic memory portion.

According to the thin-film magnetic memory device described above, a magnetic field applied in the direction of the hard axis to the memory cell can be produced more rapidly than a magnetic field in the direction of the easy axis at the start of data writing. Thereby, the magnetic memory portion of the memory cell selected as a data write target can be magnetized stably.

Preferably, supply of the second data write current ends more early than ending of supply of the first data write current at the end of the data write operation.

At the end of the data write operation, therefore, it is possible to provide a period, for which the data write magnetic field in the direction of the hard axis decreases while the data write magnetic field at a predetermined level in the direction of the easy axis is being applied. Thereby, the magnetic memory portion of the memory cell selected as a data write target can be magnetized more stably.

More preferably, each of the magnetic memory portions has a form having an aspect ratio larger than one between a long side and a short side. The first data write interconnection is arranged along the short side, and the second data write interconnection is arranged along the long side.

Thereby, it is possible to design the form of the magnetic memory portion to provide stable magnetization characteristics, and the interconnection groups for passing the data write current can be arranged efficiently.

Preferably, the plurality of memory cells are arranged in rows and columns, the first data write interconnections are arranged for the memory cell columns, respectively, and the second data write interconnections are arranged for the memory cell rows, respectively. The thin-film magnetic memory device further includes column select lines arranged for the memory cell columns, respectively, and column select line drive portions arranged for the memory cell columns, respectively, each for driving a corresponding one of the column select lines from a first voltage to a second voltage by a predetermined operation current in a selected column. The predetermined operation current is set to provide the first data write current having the rising time constant larger than the rising time constant of the second data write current.

More preferably, the column select line drive portion includes a drive gate portion for driving the corresponding column select line by one of the first and second voltages in accordance with results of column selection, and a drive current switching portion for supplying a first current as the predetermined operation current to the drive gate portion in the data write operation, and supplying a second current larger than the first current as the predetermined operation current to the drive gate portion in the data read operation.

Thereby, the column select line of the selected column can be driven rapidly in the data read operation so that the data reading can be performed further rapidly.

According to still another aspect, the invention provides a thin-film magnetic memory device for executing a page mode operation with a unit operation cycle including a row cycle for receiving input of a row address and a plurality of subsequent column cycles for receiving input of a column address in each of the column cycles, including a plurality of memory cells arranged in rows and columns, and each having a magnetic memory portion having an electric resistance varying in accordance with a magnetization direction rewritable in response to application of a predetermined data write magnetic field produced by first and second data write currents; a plurality of first data write interconnections provided for memory cell rows, respectively, for passing the first data write current in a selected row; a plurality of second data write interconnections provided for memory cell columns, respectively, for passing the second data write current in a selected column; and a row select portion for controlling supply of the first data write current to the plurality of data write interconnections. The row select portion temporarily stops supply of the first data write current corresponding to the selected row in response to every ending of the column cycle.

Preferably, the row select portion includes a latch circuit for holding row selection results corresponding to the row address applied in the row cycle, and a drive unit for activating the first data write interconnection corresponding to the selected row to pass the first data write current in accordance with the row selection results held by the latch circuit and a control signal for selectively instructing a data write operation and the data read operation.

Thereby, supply of the data write current corresponding to the selected row is temporarily stopped upon every ending of the column cycle in the page mode operation. Therefore, the page mode operation can be executed stably and rapidly with low possibility of erroneous data writing.

Preferably, one of the first and second data write currents produces a magnetic field along a easy axis in the magnetic memory portion, and the other of the first and second data write currents produces a magnetic field along a hard axis in the magnetic memory portion. In each of the column cycles including instruction of the data write operation, a rising time constant of the one of the data write currents is larger than that of the other data write current.

Preferably, each of the magnetic memory portions has a form having an aspect ratio larger than one between a long side and a short side, and one of the first and second data write interconnections carrying the one of the data write current is arranged along the short side. Other of the first and second data write interconnections carrying the other data write current is arranged along the long side.

Accordingly, a magnetic field applied in the direction of the hard axis to the memory cell can be produced more rapidly than a magnetic field in the direction of the easy axis at the start of data writing. Thereby, the magnetic memory portion of the memory cell selected as a data write target can be magnetized stably in each of the column cycles including instruction of the data writing.

Preferably, one of the first and second data write currents produces the magnetic field along a easy axis in the magnetic memory portion, and the other of the first and second data write currents produces a magnetic field along a hard axis in the magnetic memory portion. In each of the column cycles including instruction of a data write operation, supply of the one of the data write currents starts later than the supply of the other data write current.

Thereby, it is possible to design the magnetic memory portion having a form providing stable magnetization characteristics, and the interconnection groups for passing the data write currents can be arranged efficiently.

More preferably, each of the magnetic memory portions has a form having an aspect ratio larger than one between a long side and a short side, and the one of the first and second data write interconnections carrying the one of the data write currents is arranged along the short side. The other of the first and second data write interconnections carrying the other data write current is arranged along the long side.

Thereby, the data read operation and the data write operation can be combined arbitrarily with each other for execution in each column cycle during one page mode operation.

According to yet another aspect, the invention provides a thin-film magnetic memory device for executing a page mode operation with a unit operation cycle including a row cycle for receiving input of a row address and a plurality of subsequent column cycles for receiving input of a column address in each of the column cycles, including a plurality of memory cells arranged in rows and columns. Each of the memory cells has a magnetic memory portion having an electric resistance varying in accordance with a magnetization direction rewritable in response to application of a predetermined data write magnetic field produced by first and second data write currents, and an access element electrically coupled in series to the magnetic memory portion, and being selectively turned on for passing a data read current. The thin-film magnetic memory device further includes a plurality of data write select lines provided corresponding to the memory cell rows, respectively, and being selectively activated to pass the first data write current; a plurality of data read select lines provided corresponding to the memory cell rows, respectively, and being selectively activated to turn on the access element; a plurality of data lines provided corresponding to the memory cell columns, respectively; a read/write control circuit for supplying the data read current to the data line corresponding to the received column address in each of the column cycles including instruction of a data read operations, and supplying the second data write current to the data line corresponding to the received column address in each of the column cycles including instruction of a data write operation; and a row select portion for controlling activation of the plurality of first data write interconnections and the plurality of data read select interconnections in accordance with results of the row selection based on the row address. The row select portion inactivates the data read select line corresponding to the selected row, and activates the first data write interconnection corresponding to the selected row for a predetermined period in each of the column cycles including instruction of the data write operation.

The thin-film magnetic memory device described above maintains the active state of the data read select line in the selected row during a period except for the predetermined period of the column cycle, in which the data write operation is instructed. Therefore, an operation speed can be increased in each column cycle including the instruction of the read operation.

Preferably, the row select portion activates the data read select line corresponding to the selected row during a period other than the predetermined period.

Preferably, each of the memory cells is arranged to have a node electrically coupled to the corresponding first data write interconnection. The row select portion controls activation of the plurality of data read select lines such that the active period of the data read select line may not overlap in time with the supply period of the first data write current.

Preferably, each of the memory cells is electrically isolated from the corresponding first data write interconnection. The row select portion controls activation of the plurality of data read select lines such that the active period of each of the data read select lines has a portion overlapping in time with the supply period of the second data write select current.

According to further another aspect, the invention provides a thin-film magnetic memory device for executing a page mode operation with a unit operation cycle including a row cycle for receiving input of a row address and a plurality of subsequent column cycles for receiving input of a column address in each of the column cycles, including a plurality of memory cells arranged in rows and columns. Each of the memory cells has a magnetic memory portion having an electric resistance varying in accordance with a magnetization direction rewritable in response to application of a predetermined data write magnetic field produced by first and second data write currents, and an access element electrically coupled in series to the magnetic memory portion, and being selectively turned on for passing a data read current. The thin-film magnetic memory device further includes a plurality of data write select lines provided corresponding to the memory cell rows, respectively, and being selectively activated to pass the first data write current; a plurality of data read select lines provided corresponding to the memory cell rows, respectively, and being selectively activated to turn on the access element; a plurality of data lines provided corresponding to the memory cell columns, respectively; and a row select portion for controlling activation of the plurality of first data write interconnections and the plurality of data read select interconnections in accordance with results of the row selection based on the row address. The row select portion activates the data read select line corresponding to the selected row in the row cycle, and inactivates the data read select line in the column cycle. The thin-film magnetic memory device further includes a read/write control circuit for supplying the data read current to each of the data lines of at least M (M: integer larger than one) in number among the plurality of data lines in the row cycle, and supplying the second data write current to the data line corresponding to the received column address in each of the column cycles including instruction of a data write operation; a read data latch circuit for holding the storage data of M in number corresponding to the M data lines, respectively, and read from the memory cells belonging to the selected row in the row cycle; and a control circuit for instructing output of one of the M storage data corresponding to the received column address to the read data latch circuit in each of the column cycles including instruction of a data read operation.

In the thin-film magnetic memory device described above, the storage data corresponding to the selected row is read in the row cycle, and is held during the unit operation cycle. Therefore, the operation speed can be increased in each of subsequent column cycles, in which the data read operation is instructed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
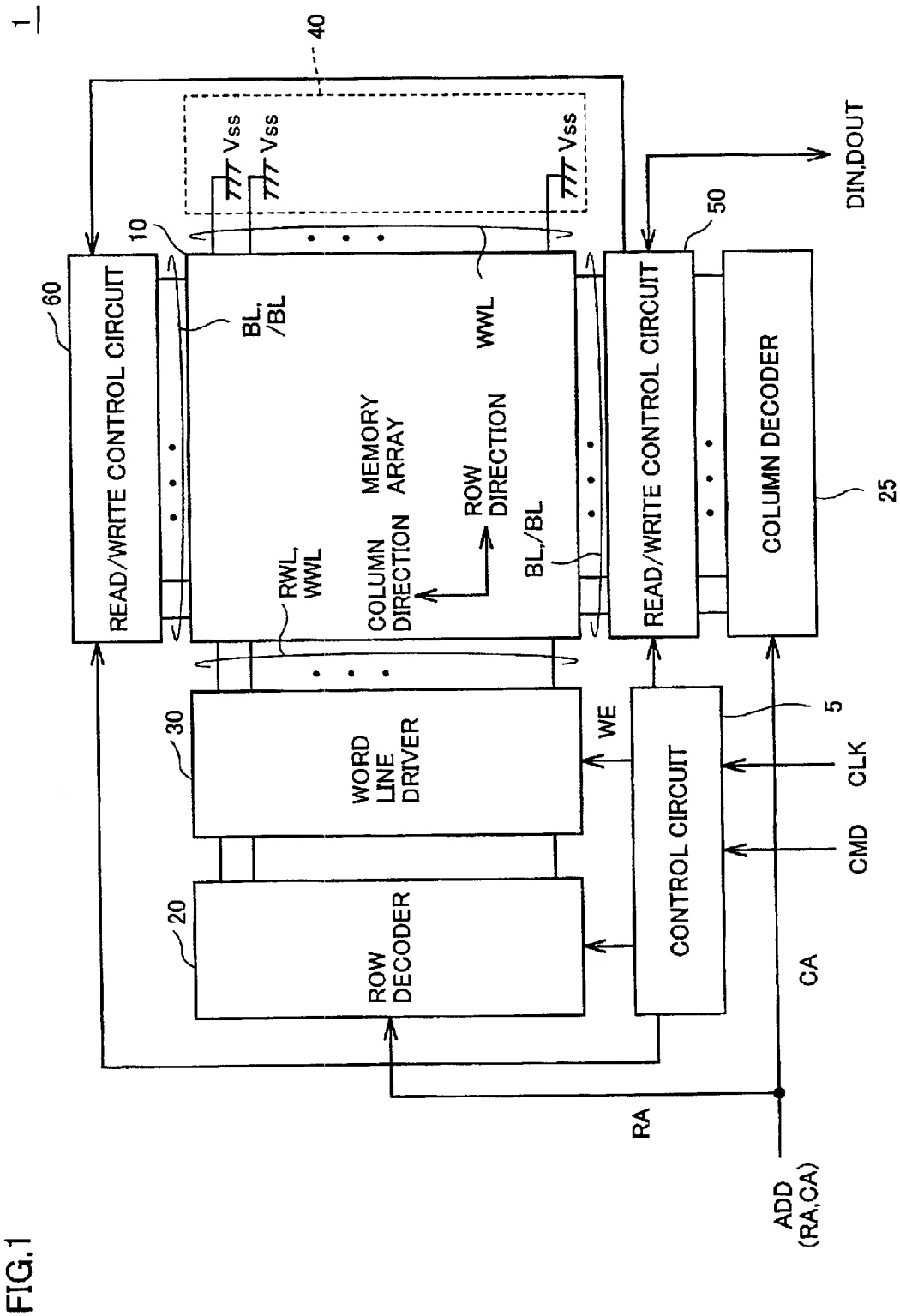
FIG. 1 is a schematic block diagram showing a whole structure of an MRAM device according to a first embodiment of the invention.

Referring to FIG. 1, an MRAM device 1 according to a first embodiment of the invention executes random access in response to a control signal CMD and an address signal ADD, which are externally applied, and executes input of write data DIN or output of read data DOUT. The data read operation and data write operation in MRAM device 1 are executed in accordance with timing, e.g., synchronized with an externally applied clock signal CLK. Alternatively, MRAM device 1 may internally determine the operation timing without receiving externally applied clock signal CLK.

MRAM device 1 includes a control circuit 5 for controlling a whole operation of MRAM device 1 in response to control signal CMD, and a memory array 10 having a plurality of MTJ memory cells arranged in rows and columns. Memory array 10 includes a plurality of write word lines WWL and a plurality of read word lines RWL corresponding to rows of the MTJ memory cells, which may be merely referred to as "memory cell rows" hereinafter, although the structure of memory array 10 will be described later in greater detail. Also, bit lines BL and /BL are arranged corresponding to columns of the MTJ memory cells, which may be merely referred to as "memory cell columns" hereinafter.

MRAM device 1 further includes a row decoder 20, a column decoder 25, a word line driver 30 and read/write control circuits 50 and 60.

Row decoder 20 executes row selection in memory array 10 in accordance with a row address RA represented by address signal ADD. Column decoder 25 executes column selection in memory array 10 in accordance with a column address CA represented by address signal ADD. Word line driver 30 selectively activates read word line RWL and write word line WWL based on results of row selection of row decoder 20. Row address RA and column address CA indicate the memory cell, which is designed or selected as a target of data reading or writing, and may be referred to as a "selected memory cell" hereinafter.

Write word line WWL is coupled to a ground voltage Vss in a region 40 spaced from word line driver 30 with memory array 10 therebetween. Read/write control circuits 50 and 60 collectively represent circuit groups, which are arranged in regions neighboring to memory array 10 for supplying data write currents and sense currents (data read currents) to bit lines BL and /BL in a selected memory cell column (which may be referred to as a "selected column" hereinafter) corresponding to the selected memory cell.

Figure 2:
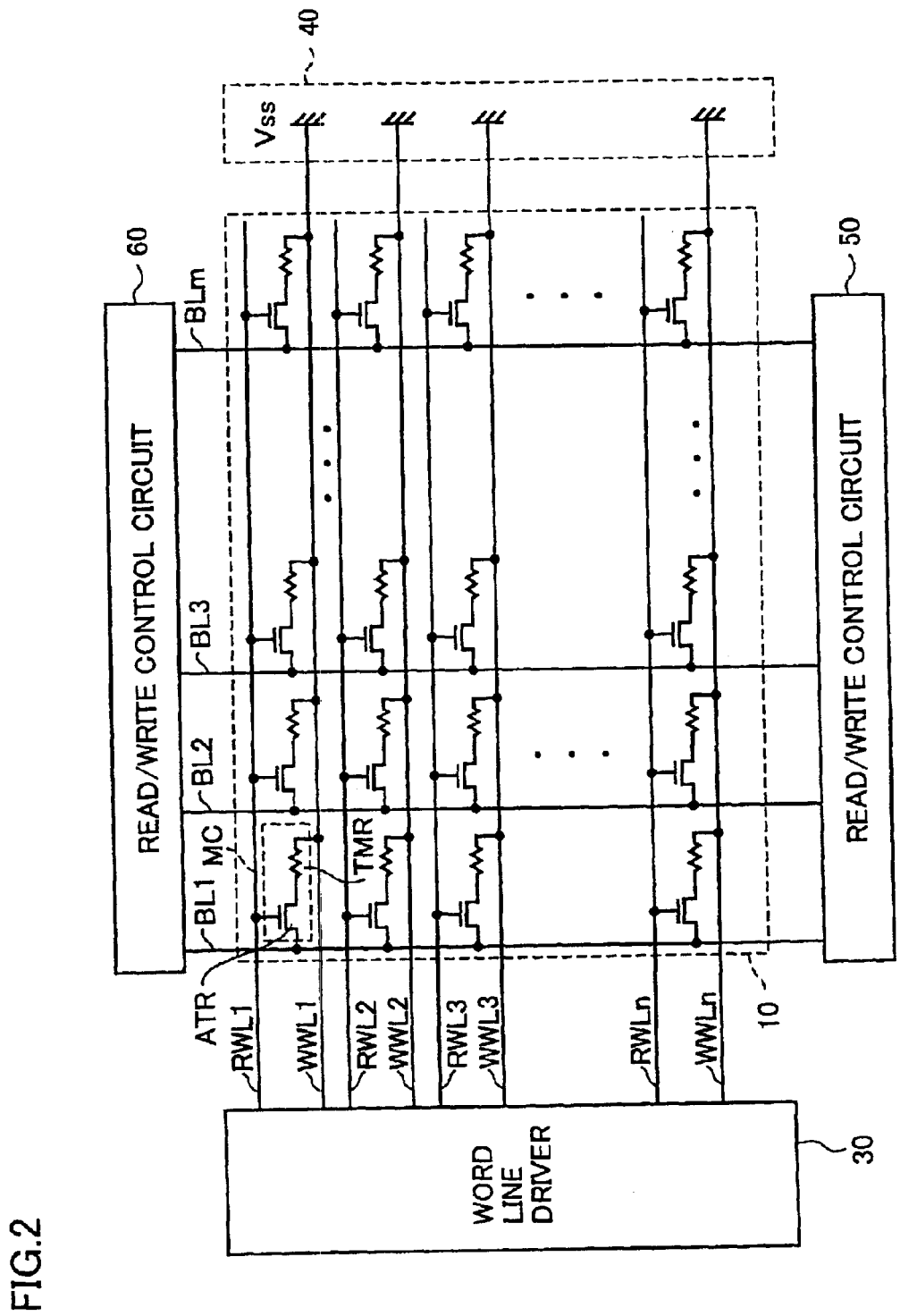
FIG. 2 is a circuit diagram showing a structure of a memory array shown in FIG. 1.

Referring to FIG. 2, memory array 10 has MTJ memory cells MC arranged in n rows and m columns (n, m: natural numbers). In memory array 10, read word lines RWL1–RWLn as well as write word lines WWL1–WWLn are arranged corresponding to memory cell rows, respectively, and bit lines BL1–BLm are arranged corresponding to memory cell columns, respectively.

In the following description, reference character sets "WWL", "RWL" and "BL" are used for collectively or generally indicating the write word line(s), read word line(s) and bit line(s), respectively. Reference character sets such as "WWL1", "RWL1" and "BL1", which include suffixes added to the above sets, are used for specifically indicating the write word line, read word line and bit line, respectively. A high voltage state (power supply voltage Vcc) and a low voltage state (ground voltage Vss) of each of signals and signal lines may be referred to as "H-level" and "L-level" hereinafter, respectively.

Each MTJ memory cell MC has a tunneling magneto-resistance element TMR operating as a magnetic memory portion, of which electric resistance is variable in accordance with a level of storage data, and an access transistor ATR operating as an access element and connected in series to tunneling magneto-resistance element TMR. As already described, access transistor ATR is typically formed of an MOS transistor, which is a field-effect transistor formed on a semiconductor substrate.

Tunneling magneto-resistance element TMR is electrically coupled between access transistor ATR and corresponding write word line WWL. Access transistor ATR is electrically coupled between corresponding bit line BL and tunneling magneto-resistance element TMR.

A gate of access transistor ATR is coupled to corresponding read word line RWL. Access transistor ATR is turned on to couple electrically tunneling magneto-resistance element TMR between corresponding bit line BL and write word line WWL when read word line RWL is activated to attain H-level. When read word line RWL is inactive (L-level), access transistor ATR is turned off to isolate electrically bit line BL from tunneling magneto-resistance element TMR.

Owing to the above structure, tunneling magneto-resistance element TMR and bit line BL are not coupled directly, but are coupled via access transistor ATR. Thereby, each bit line BL is not directly coupled to the plurality of tunneling magneto-resistance elements TMR belonging to the corresponding memory cell column, but are electrically coupled only to the tunneling magneto-resistance element of the selected memory cell, i.e., a data read target. Thereby, a capacitance of bit line BL can be small, and an operation speed during data reading can be increased.

Further, tunneling magneto-resistance element TMR can be pulled down to ground voltage Vss in the data read operation by using write word line WWL. Therefore, it is not necessary to employ an interconnection dedicated to supply of ground voltage Vss, and metal interconnections required for forming the MRAM device can be reduced in number.

Figure 3:
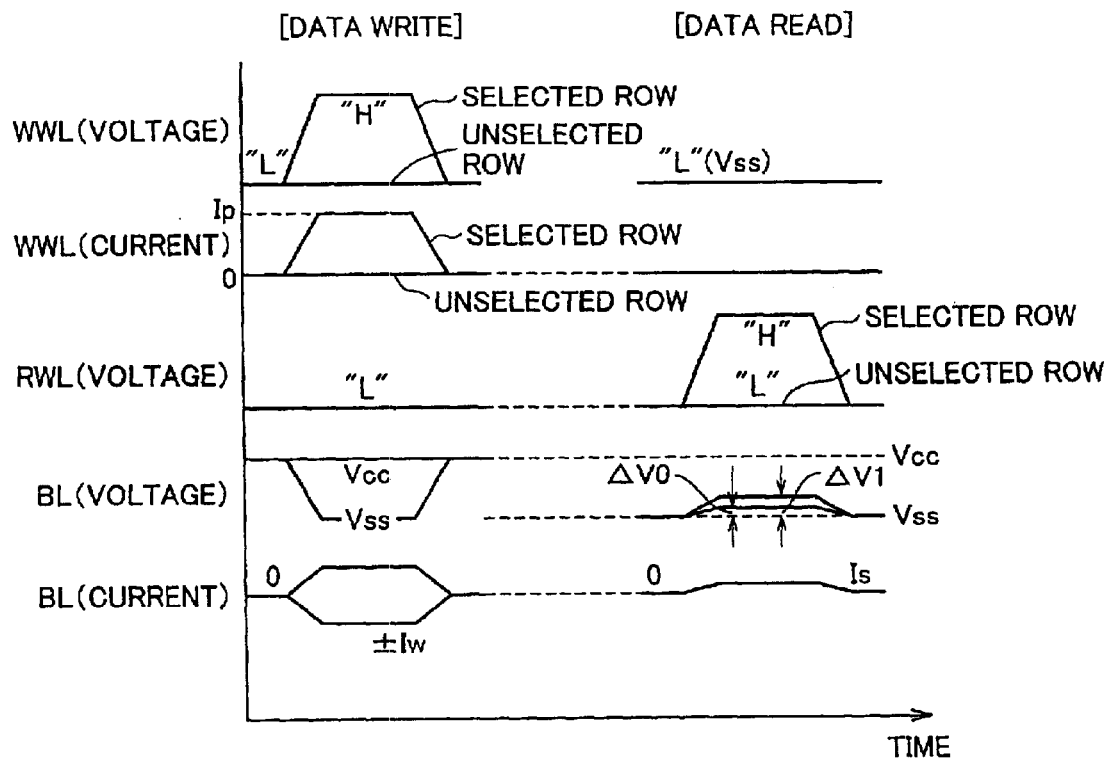
FIG. 3 is an operation waveform diagram representing operations for data writing and data reading in the memory array shown in FIG. 2.

Referring to FIG. 3, description will now be given on operations of writing and reading data in the memory array shown in FIG. 2.

First, operations for data writing are described. Word line driver 30 activates and connects write word line WWL, which corresponds to the selected row, to power supply voltage Vcc in accordance with results of row selection of row decoder 20. An end of each write word line WWL is coupled to ground voltage Vss in region 40. Therefore, write word line WWL in the selected row carries a data write current Ip from word line driver 30 toward region 40.

In the unselected row, write word line WWL can be maintained in an inactive state (L-level of ground voltage Vss) so that the data write current does not flow. Each read word line RWL is maintained in an inactive state (L-level) in the data write operation.

Read/write control circuits 50 and 60 control the voltages on the opposite ends of bit line BL in the selected column, respectively, and thereby produce the data write current having a direction depending on the data level of the write data. When storage data, e.g., of "1" is to be written, the bit line voltage on the side of read/write control circuit 60 is set to a high voltage state (power supply voltage Vcc), and the bit line voltage on the opposite side, i.e., the side of read/write control circuit 50 is set to a low voltage state (ground voltage Vss). Thereby, data write current +Iw can be passed through the bit line in the selected column from read/write control circuit 60 toward read/write control circuit 50.

When storage data of "0" is to be written, the voltage polarities of the bit line on the opposite sides, i.e., the sides of read/write control circuits 50 and 60 are inverted to flow a data write current −Iw from read/write control circuit 50 toward read/write control circuit 60. Thereby, data write current Ip and both data write currents ±Iw can be supplied so that the data write magnetic fields corresponding to the level of the write data can be applied to the selected memory cell selected as the data write target.

Description will now be given on the data read operation.

In the data read operation, word line driver 30 activates read word line RWL corresponding to the selected row to H-level in accordance with results of the row selection of row decoder 20. In the unselected row, the voltage level of read word line RWL is kept inactive (at L-level), and each of write word lines WWL is kept at ground voltage Vss so that each MTJ memory cell is pulled down to ground voltage Vss.

Bit line BL is precharged to ground voltage Vss before the data read operation. In this state, the bit line in the selected column is pulled up by read/write control circuit 50, e.g., with power supply voltage Vcc, and is supplied with a constant sense current Is.

When data reading starts, read word line RWL in the selected row is activated to attain H-level, and corresponding access transistor ATR is turned on. Thereby, the MTJ memory cell corresponding to the selected row is electrically coupled between the bit line pulled up with power supply voltage Vcc and write word line WWL at the level of ground voltage Vss via access transistor ATR. Thereby, sense current Is passes through tunneling magneto-resistance element TMR of the selected memory cell. Therefore, voltage drop ($\Delta V0$ or $\Delta V1$ in FIG. 3) corresponding to the level of the storage data of the selected memory cell occurs in the selected memory cell selected as the data read target.

Arrangement of the MTJ memory cell in the above MRAM device will now be described.

Figure 4:
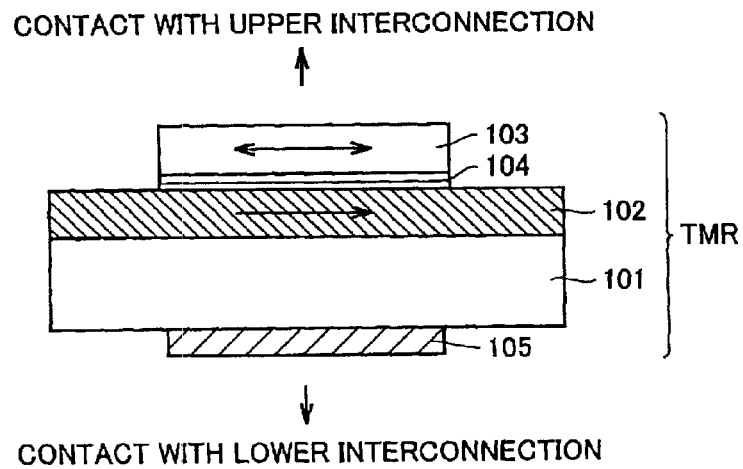
FIG. 4 is a cross section showing a structure of a tunneling magneto-resistance element in an MTJ memory cell.

Referring to FIG. 4, tunneling magneto-resistance element TMR corresponding to the magnetic tunnel junction includes an antiferromagnetic material layer 101, a partial region of a fixed magnetic layer 102 formed on antiferromagnetic material layer 101 and having a fixed magnetic field in a uniform direction, a free magnetic layer 103 magnetized by an applied magnetic field, a tunneling barrier 104 made of an insulator film formed between fixed magnetic layer 102 and free magnetic layer 103, and a contact electrode 105.

Antiferromagnetic material layer 101, fixed magnetic layer 102 and free magnetic layer 103 are formed of appropriate magnetic materials such as FeMn or NiFe. Tunneling barrier 104 is formed of $Al_2O_3$ or the like. Tunneling magneto-resistance element TMR is electrically coupled to an upper interconnection via a barrier metal, which is arranged, if necessary, and is formed of a buffer member for electrical coupling to the metal interconnection, although not shown.

Contact electrode 105 is electrically coupled to a lower interconnection. For example, the upper interconnection corresponds to bit line BL, and the lower interconnection corresponds to the metal interconnection coupled to access transistor ATR.

Figure 5:
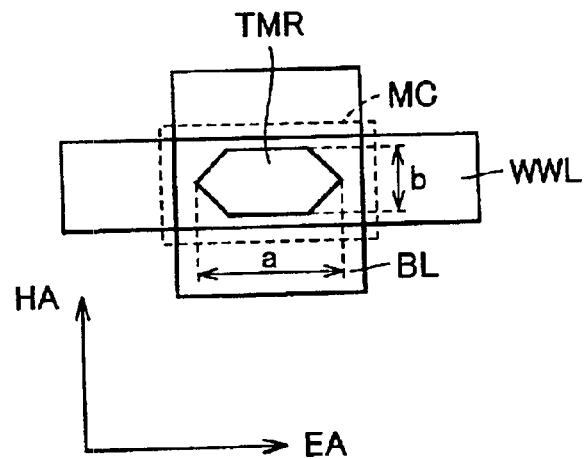
FIG. 5 conceptually shows an arrangement of bit lines BL and write word lines WWL for the tunneling magneto-resistance element according to the first embodiment.

Referring to FIG. 5, tunneling magneto-resistance element TMR has an elongated or rectangular form having an aspect ratio (i.e., a ratio between a long side length "a" and a short side length "b" in FIG. 5), which substantially falls within a range from 2:1 to 4:1. According to this form, the easy axis (EA) and hard axis (HA) in the tunneling magneto-resistance element are parallel to the long side and the short side, respectively.

Figure 29:
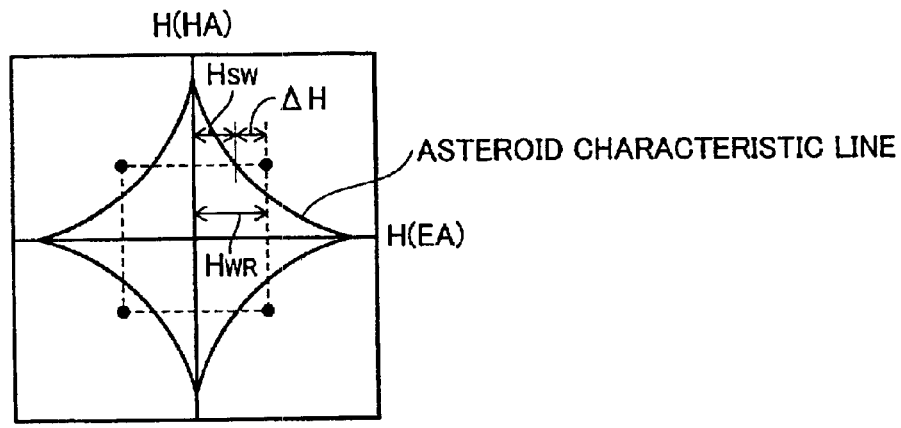
FIG. 29 conceptually shows a relationship between a data write current and a magnetization direction of a tunneling magneto-resistance element in the operation of writing data into the MTJ memory cell.
Figure 30:
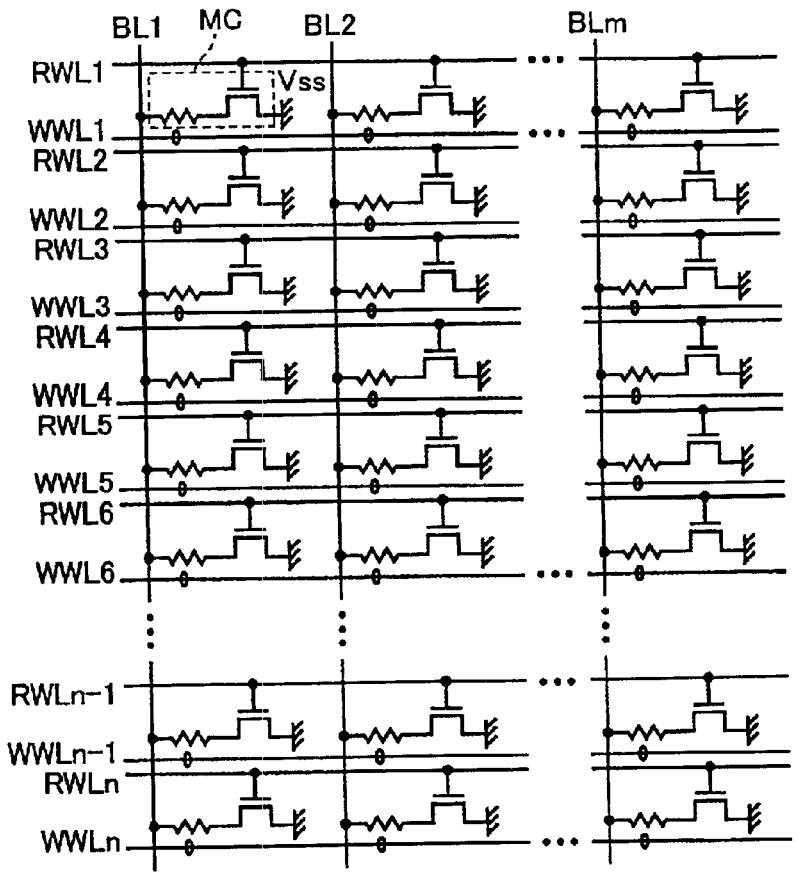
FIG. 30 conceptually shows a structure of a memory array formed of MTJ memory cells arranged in rows and columns.

Further, the rectangular form is chamfered to prevent occurrence of unnecessary magnetization in the direction of hard axis (HA) in the vicinities of ends. As a result, it is possible to establish a correlation between the two kinds of magnetization directions along the easy axis in the free magnetic layer of the tunneling magneto-resistance element and the level of the write data, and thereby a data storing operation can be performed with high reliability. In connection with this, a threshold required for inverting magnetization in the direction of the easy axis can be lowered by applying a magnetic field in the direction of the hard axis. In view of the above magnetization characteristics, the operation point, i.e., the applied magnetic field in the data writing is set to be adapted to the case, where the data write currents in both the row and column directions are applied, as already described with reference to FIG. 29.

As described above, the form of the tunneling magneto-resistance element, i.e., the form of the MTJ memory cell can be designed in view of stability of the magnetization operation in the data write operation. Thereby, such a layout is naturally determined that bit line BL for generating the data write magnetic field in the direction of the easy axis has an interconnection width larger than that of write word line WWL for generating the magnetic field in the direction of the hard axis. Therefore, the area of the memory array can be reduced.

In other words, bit line BL has the interconnection width in the direction of the long side, and write word line WWL has the interconnection width in the direction of the short side. Therefore, it is easy to provide bit line BL having the interconnection width larger than that of write word line WWL.

Figure 6:
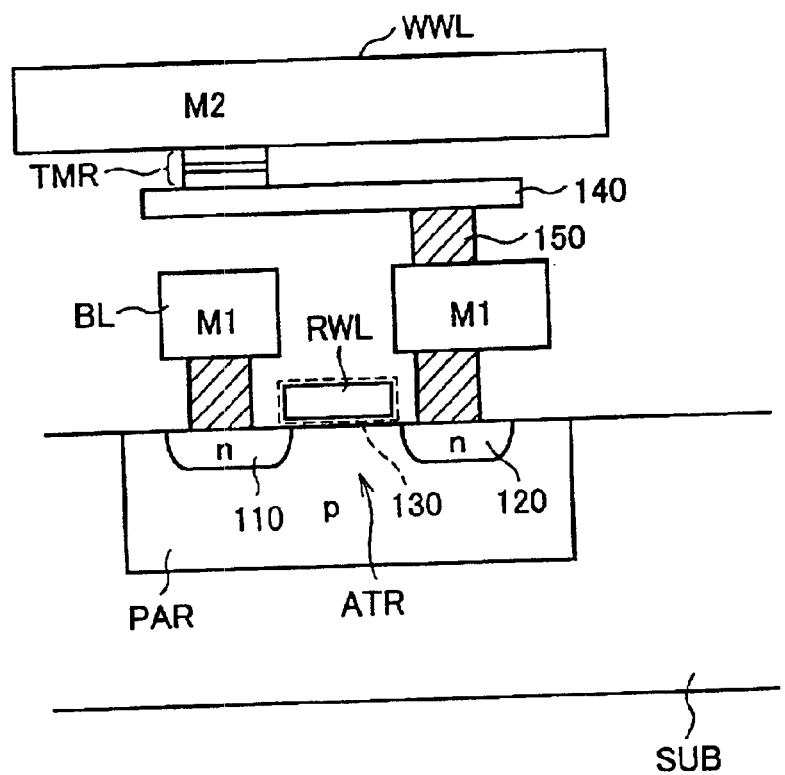
FIG. 6 shows a structure of the tunneling magneto-resistance element according to the first embodiment.

Referring to FIG. 6, access transistor ATR is formed at a p-type region PAR on a semiconductor main substrate SUB. Access transistor ATR has source/drain regions 110 and 120 formed of n-type regions as well as a gate 130. Source/drain region 110 is coupled to bit line BL formed at a first metal interconnection layer M1.

Read word line RWL is provided for controlling the gate voltage of access transistor ATR, and it is not necessary to pass positively or actively a current therethrough. For increasing the density or degree of integration, read word line RWL is not formed at an independent metal interconnection layer dedicated thereto, but is formed at the same interconnection layer as gate 130 by using a polycrystalline silicon layer or a polycide structure.

Source/drain region 120 of access transistor ATR is electrically coupled to tunneling magneto-resistance element TMR via a metal film 150 formed in a contact hole, first metal interconnection layer M1 and a barrier metal 140. Barrier metal 140 is a buffer member provided for electrically coupling tunneling magneto-resistance element TMR to the metal interconnection.

Write word line WWL is formed at a second metal interconnection layer M2, and is electrically coupled to tunneling magneto-resistance element TMR.

As described above, bit line BL and write word line WWL for carrying the data write currents are arranged on the semiconductor substrate bearing the MRAM device such that a distance between bit line BL, which has the interconnection width in the direction of the long side of tunneling magneto-resistance element TMR, and tunneling magneto-resistance element TMR is larger than a distance between write word line WWL, which has the interconnection width in the direction of the short side of tunneling magneto-resistance element TMR, and tunneling magneto-resistance element TMR.

Thus, the interconnection, which must carry a larger current in the data write operation, and is located relatively remote from tunneling magneto-resistance element TMR, is used as bit line BL, of which interconnection width can be increased easily. Thereby, it is possible to lower a current density of write word line WWL, of which interconnection width cannot not be easily increased. In the MRAM device provided with the MTJ memory cells having stable data write characteristics, therefore, the interconnection groups for passing the data write currents can be efficiently arranged so as to prevent lowering of the operation reliability.

A system LSI or the like, which has a memory and a logic embedded on a common chip, is generally designed such that a metal interconnection layer at a higher level has a larger film thickness. By arranging write word line WWL at a higher level as shown in FIG. 6, therefore, it is easy to ensure an appropriate sectional area of write word line WWL, which cannot generally have an sufficient interconnection width due to a relationship to the form of tunneling magneto-resistance element TMR. Therefore, the MRAM device according to the first embodiment can be easily applied to the memory device of a logic-embedded type.

In the structure shown in FIG. 6, bit line BL and thus metal interconnection layer M1 may be designed to have large interconnection thickness and film thickness, respectively, whereby it is possible to prevent increase in current density of bit line BL carrying a larger data write current while reducing an interconnection width thereof. As a result, the memory cell size can be reduced while giving consideration to the form of tunneling magneto-resistance element TMR.

Second Embodiment

In the data write operation, as already described in connection with the first embodiment, two kinds of data write magnetic fields are applied in the directions of the hard axis and easy axis to the MTJ memory cell, respectively. A second embodiment will now be described in connection with a method of supplying the data write current for stably magnetizing the tunneling magneto-resistance element forming each MTJ memory cell in the data write operation.

Figure 7:
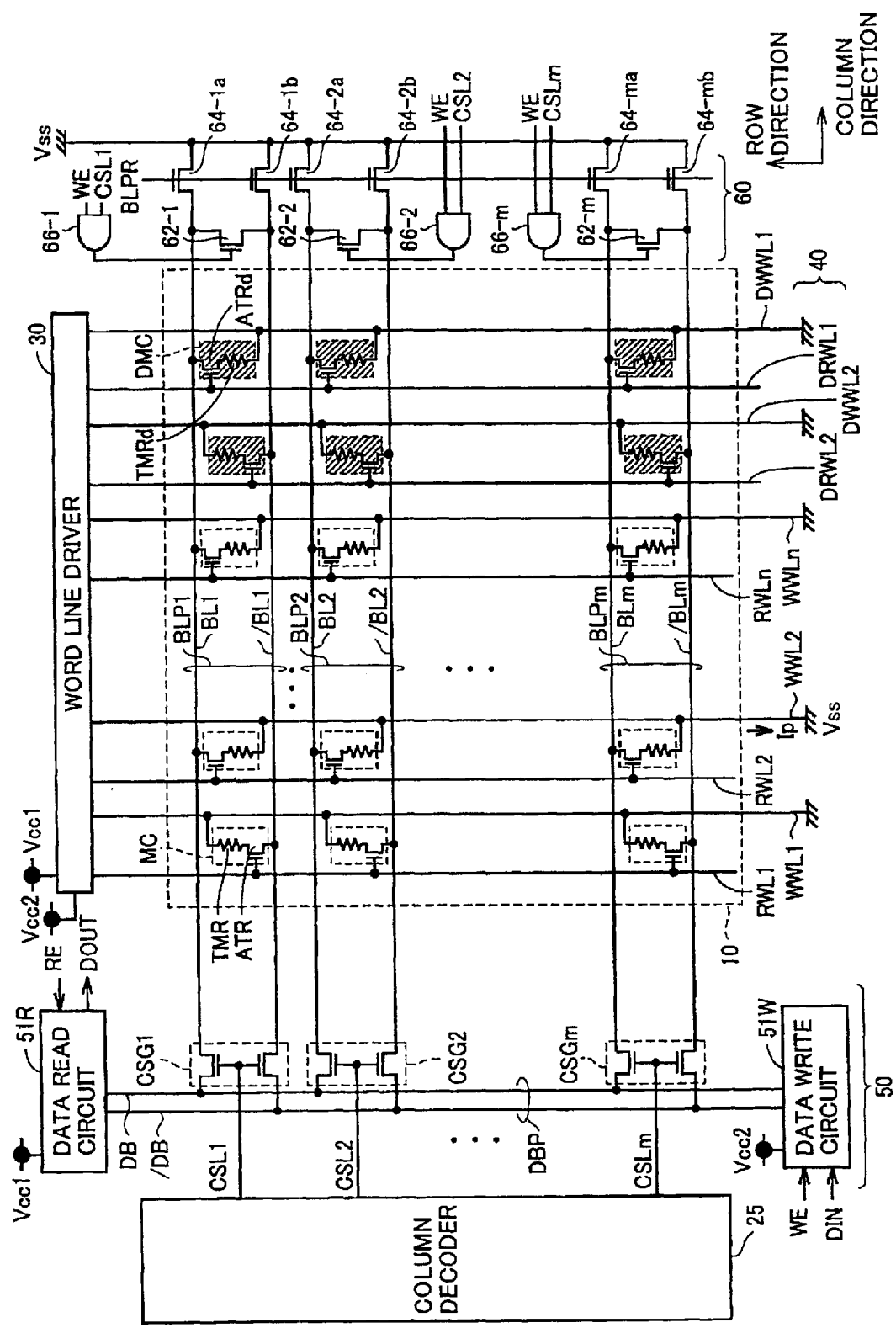
FIG. 7 is a circuit diagram showing structures of a memory array and its peripheral circuit according to a second embodiment.

Referring to FIG. 7, read word lines RWL1–RWLn as well as write word lines WWL1–WWLn in a memory array according to the second embodiment are arranged corresponding to the memory cell columns similarly to the memory array shown in FIG. 2, respectively. Bit lines BL1 and /BL1–BLm and /BLm are arranged to form bit line pairs BLP1–BLPm corresponding to memory cell columns, respectively. In the following description, bit lines /BL1–BLm may be collectively represented as "bit lines /BL".

MTJ memory cells MC in alternate rows are connected to the same kind of bit lines BL or /BL. For example, among the MTJ memory cells belonging to the first memory cell column, the MTJ memory cell in the first row is coupled to bit line /BL1, and the MTJ memory cell in the second row is coupled to bit line BL1. The other MTJ memory cells are connected in a similar manner so that the memory cells in each of the odd-numbered rows are connected to one kind of bit lines /BL1–/BLm in the bit line pairs, respectively, and the MTJ memory cells in each of the even-numbered rows are connected to the other kind of the bit lines BL1–BLm, respectively.

In the structure according to the second embodiment, memory array 10 further has a plurality of dummy memory cells DMC coupled to bit lines BL1 and /BL1–BLm and /BLm. Dummy memory cells DMC are arranged in two rows and m columns so that each dummy memory cell DMC may correspond to either dummy read word line DRWL1 or DRWL2. The dummy memory cells corresponding to the dummy read word line DRWL1 are coupled to bit lines BL1, BL2, ... and BLm, respectively. The other dummy memory cells corresponding to dummy read word line DRWL2 are coupled to bit lines /BL1, /BL2, ... and /BLm, respectively.

Dummy memory cell DMC has a dummy resistance element TMRd and a dummy access element ATRd. Dummy resistance element TMRd has an electric resistance Rd of a value intermediate between electric resistances Rmax and Rmin, which correspond to storage data levels "1" and "0" of MTJ memory cell MC, respectively, and satisfy a relationship of Rmax>Rd>Rmin. Dummy access element ATRd is typically formed of a field-effect transistor, similarly to the access element of the MTJ memory cell. Therefore, the dummy access element may be referred to as "dummy access transistor ATRd" hereinafter.

Further, dummy write word lines DWWL1 and DWWL2 are arranged corresponding to each row of the dummy memory cells. Depending on the structure of dummy resistance element TMRd, the dummy write word line may be unnecessary, but dummy write word lines DWWL1 and DWWL2 having the same design as write word lines WWL are provided for ensuring continuity of the forms or configurations on the memory array, and thereby avoiding complication of manufacturing processes.

In the data read operation, when an odd-numbered row is selected in accordance with results of the row selection, each of bit lines /BL1–/BLm is coupled to MTJ memory cell MC. In this case, dummy read word line DRWL1 is activated, and each of bit lines BL1–BLm is coupled to dummy memory cell DMC. When an even-numbered row is selected and each of bit lines BL1–BLm is coupled to MTJ memory cell MC, dummy read word line DRWL2 is activated, and each of bit lines /BL1–/BLm is coupled to dummy memory cell DMC.

Dummy read word lines DRWL1 and DRWL2 may be collectively referred to as "dummy read word line(s) DRWL".

Word line driver 30 couples an end of write word line WWL in the selected row to a power supply voltage Vcc2 in the data write operation. Thereby, data write current Ip in the row direction can flow through write word line WWL in the selected row in the direction from word line driver 30 to region 40. The write word lines in the unselected rows are coupled to ground voltage Vss by word line driver 30.

In the data read operation, word line driver 30 selectively activates read word line RWL and dummy read word lines DRWL1 and DRWL2 to H-level (power supply voltage Vcc1) in accordance with results of the row selection. More specifically, when an odd-numbered row is selected to connect the MTJ memory cell group in the selected row to bit lines /BL1–/BLm, dummy read word line DRWL1 is activated to connect the dummy memory cell group to bit lines BL1–BLm. When an even-numbered row is selected, dummy read word line DRWL2 is activated.

Column select lines CSL1–CSLm for executing the column selection are arranged corresponding to the memory cell columns, respectively. Column decoder 25 activates one of column select lines CSL1–CSLm to the selected state (H-level) in accordance with results of decoding of column address CA, i.e., results of the column selection in each of the data write operation and data read operation.

Further, a data bus pair DBP is arranged for transmitting the read and write data. Data bus pair DBP includes data buses DB and /DB complementary to each other.

Read/write control circuit 50 includes a data write circuit 51W, a data read circuit 51R and column select gates CSG1–CSGm, which are provided corresponding to the memory cell columns, respectively.

Since each of column select gates CSG1–CSGm has a similar structure, description will now be representatively given on the structure of column select gate CSG1 provided for bit lines BL1 and /BL1.

Column select gate CSG1 has a transistor switch electrically coupled between data bus DB and bit line BL1, and a transistor switch electrically coupled between data bus /DB and bit line /BL1. These transistor switches are turned on and off in accordance with the voltage on column select line CSL1. When column select line CSL1 is activated to attain the selected state (H-level), column select gate CSG1 electrically couples data buses DB and /DB to bit lines BL1 and /BL1, respectively.

In the following description, column select lines CSL1–CSLm and column select gates CSG1–CSGm will be collectively and merely referred to as "column select line(s) CSL" and "column select gate(s) CSG", respectively.

Read/write control circuit 60 has short-circuit switch transistors 62-1–62-m as well as control gates 66-1–66-m, which are provided corresponding to the memory cell columns, respectively. Read/write control circuit 60 further has precharge transistors 64-1a and 64-1b–64-ma and 64-mb, which are arranged between ground voltage Vss and bit lines BL1 and /BL1–BLm and /BLm, respectively.

In the following description, short-circuit transistors 62-1–62-m, precharge transistors 64-1a and 64-1b–64-ma and 64-*mb*, and control gates 66-1–66-*m* may be collectively referred to as "short-circuit transistor(s) 62", "precharge transistor(s) 64" and "control gate(s) 66".

Each control gate 66 outputs results of logical AND between corresponding column select line CSL and control signal WE. Therefore, the output of control gate 66 corresponding to the selected column is selectively activated to attain H-level in the data write operation.

Short-circuit switch transistor 62 is turned on/off in response to the output of corresponding control gate 66. In the data write operation, therefore, short-circuit switch transistor 62 electrically couples ends on one side of bit lines BL and /BL corresponding to the selected column to each other.

Each precharge transistor 64 is turned on to precharge bit lines BL1 and /BL1–BLm and /BLm to ground voltage Vss in response to activation of a bit line precharge signal BLPR. Bit line precharge signal BLPR produced by control circuit 5 is activated to attain H-level for at least a predetermined period before execution of the data reading while MRAM device 1 is active. While MRAM device 1 is active, and particularly in the data read operation and data write operation, bit line precharge signal BLPR is inactivated to attain L-level, and precharge transistor 64 is turned off.

Description will now be given on the structures of the data read circuit and the data write circuit.

Figure 8:
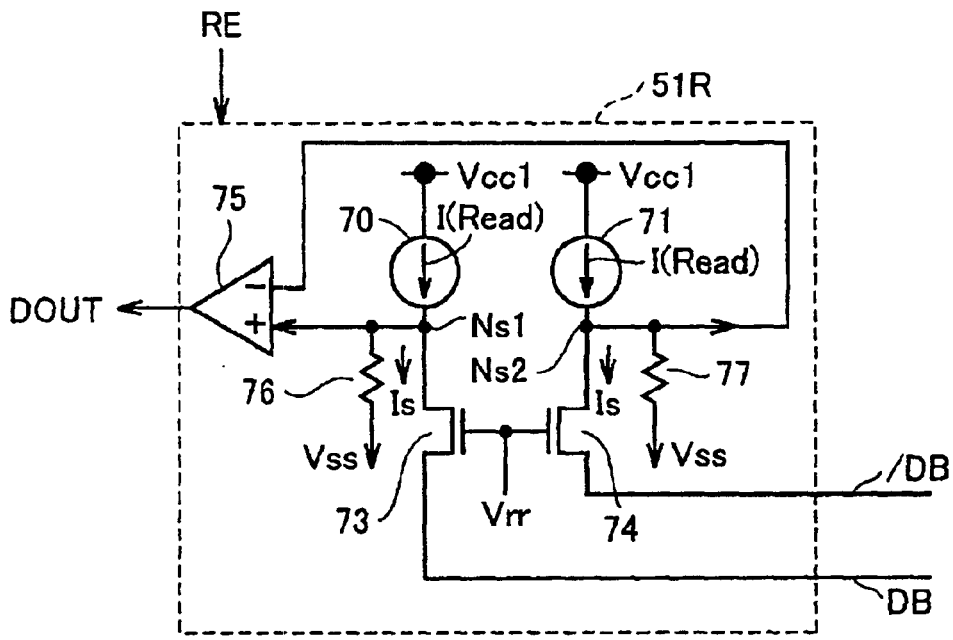
FIG. 8 is a circuit diagram showing a structure of a data read circuit shown in FIG. 7.

Referring to FIG. 8, data read circuit 51R includes constant-current supply circuits 70 and 71, which receive power supply voltage Vcc1 and supply a constant current I(Read) to internal nodes Ns1 and Ns2, respectively, an N-channel MOS transistor 73 electrically coupled between internal node Ns1 and data bus DB, an N-channel MOS transistor 74 electrically coupled between internal node Ns2 and data bus /DB, an amplifier 75 for amplifying a voltage level difference between internal nodes Ns1 and Ns2 to output read data DOUT, and resistances 76 and 77.

Each of N-channel MOS transistors 73 and 74 receives reference voltage Vrr on its gate. Resistances 76 and 77 are provided for pulling down internal nodes Ns1 and Ns2 to ground voltage Vss, respectively. Owing to this structure, data read circuit 51R can supply sense current Is corresponding to constant current I(Reed) to each of data buses DB and /DB in the data read operation.

In the data read operation, each of data buses DB and /DB is pulled down to ground voltage Vss via one of bit lines BL and /BL and one of the selected memory cell and the dummy memory cell. Thereby, data read circuit 51R can amplify the voltage difference between internal nodes Ns1 and Ns2, and thereby can read out the storage data in the selected memory cell.

Figure 9:
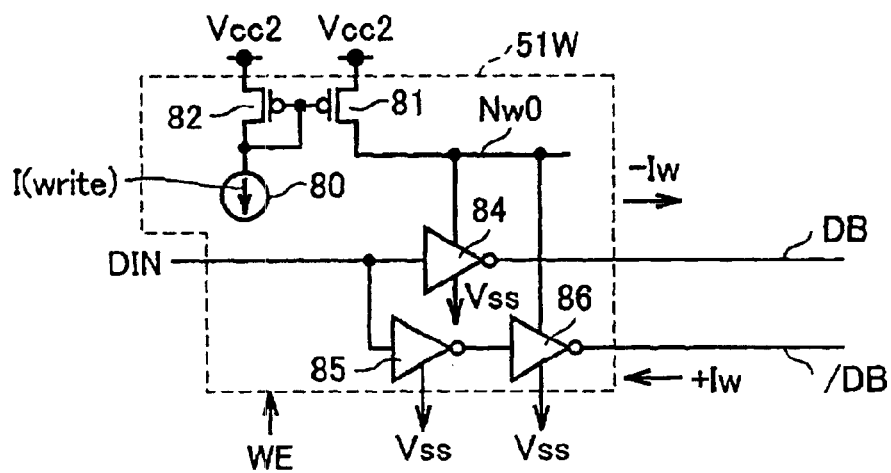
FIG. 9 is a circuit diagram showing a structure of a data write circuit shown in FIG. 7.

Referring to FIG. 9, data write circuit 51W has a constant-current supply circuit 80 for supplying a constant current I(write), and P-channel MOS transistors 81 and 82 forming a current mirror circuit. Thereby, the current supplied to an internal node Nw0 is set in accordance with constant current I(write).

Data write circuit 51W further has inverters 84, 85 and 86, which receive an operation current via internal node Nw0. Each of inverters 84, 85 and 86 receives power supply voltage Vcc2 and ground voltage Vss.

Inverter 84 inverts the voltage level of write data DIN, and transmits the same to data bus DB. Inverter 85 inverts the voltage level of write data DIN, and transmits the same to an input node of inverter 86. Inverter 86 inverts the output of inverter 84, and transmits the same to data bus /DB. Therefore, data write circuit 51W sets the voltages on data buses DB and /DB to power supply voltage Vcc2 and ground voltage Vss in accordance with the level of write data DIN, respectively.

Thereby, data write current ±Iw in the direction depending on the level of write data DIN can flow through a path formed of data bus DB (/DB), column select gate CSG, bit line BL (/BL), short-circuit switch transistor 62, bit line /BL (BL), column select gate CSG and data bus /DB (DB) in the selected column.

Power supply voltage Vcc2, which is the operation voltage of data write circuit 51W, is set higher than voltage Vcc1, which is the operation voltage of data read circuit 51R. This is because data write currents Ip and ±Iw, which are required for magnetizing tunneling magneto-resistance element TMR of the selected memory cell in the data write operation, are larger than sense current Is required for data reading. For example, power supply voltage Vcc2 may be formed of an external power supply voltage itself, which is externally supplied to MRAM device 1, and this external power supply voltage may be lowered by a voltage drop converter (not shown) to generate power supply voltage Vcc1. By this structure, these power supply voltages Vcc1 and Vcc2 can be efficiently supplied.

Description will now be given on structures of the column decoder and the word line driver.

Figure 10:
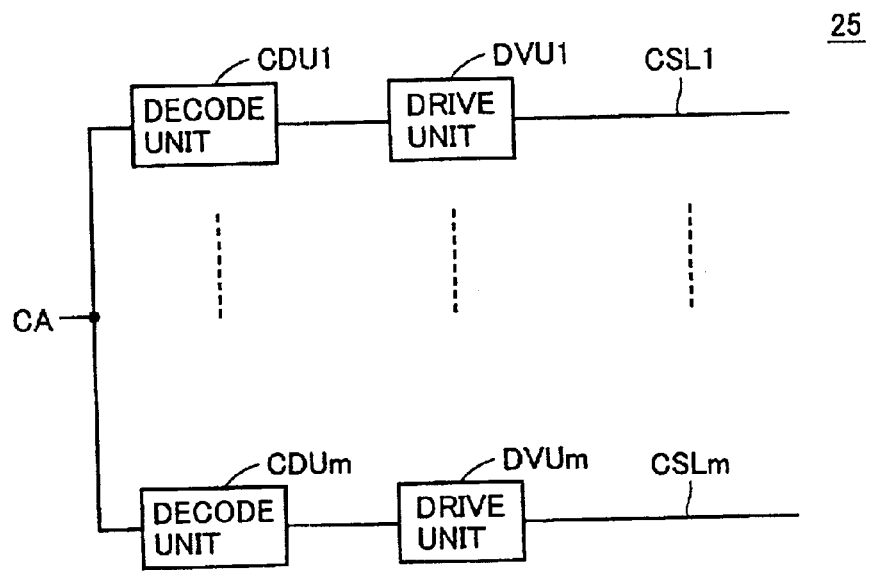
FIG. 10 is a block diagram showing a structure of a column decoder shown in FIG. 7.

Referring to FIG. 10, column decoder 25 has decode units CDU1–CDUm as well as drive units DVU1–DVUm, which are provided corresponding to the memory cell columns, respectively. Each of decode units CDU1–CDUm receives column address CA, and activates its output to attain L-level when the corresponding memory cell column is selected. Drive units DVU1–DVUm drive column select lines CSL1–CSLm in response to the outputs of decode units CDU1–CDUm, respectively.

Drive units DVU1–DVUm have the same structure. Therefore, FIG. 11 representatively shows only drive unit DVU1 corresponding to column select line CSL1.

Figure 11:
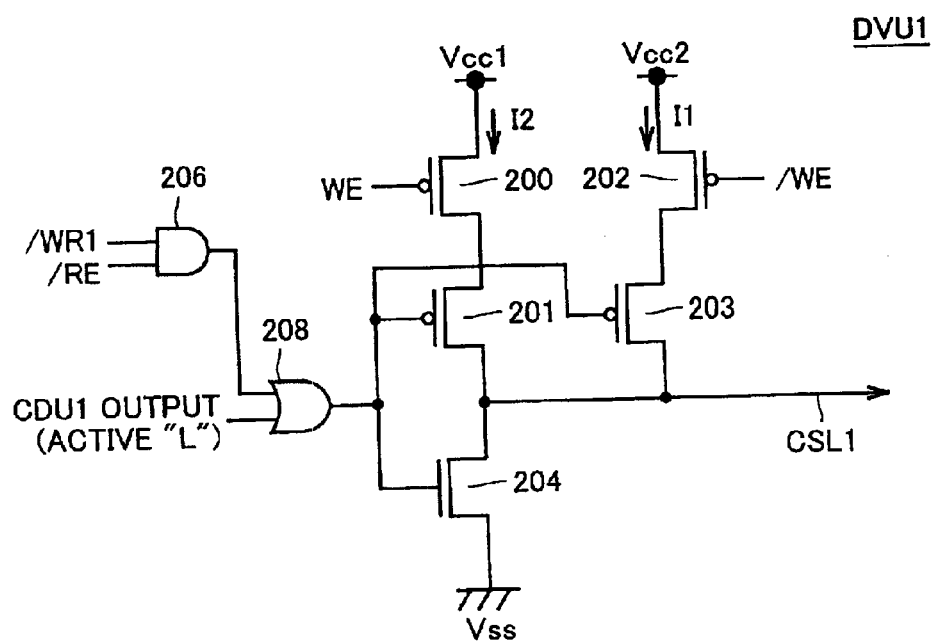
FIG. 11 is a circuit diagram showing a structure of a drive unit shown in FIG. 10.

Referring to FIG. 11, drive unit DVU1 has P-channel MOS transistors 200 and 201 connected in series between power supply voltage Vcc1 and column select line CSL1, P-channel MOS transistors 202 and 203 connected in series between power supply voltage Vcc2 and column select line CSL1, and an N-channel MOS transistor 204 connected between column select line CSL1 and ground voltage Vss.

Drive unit DVU1 further has logic gates 206 and 208. Logic gate 206 outputs results of logical AND between control signals /RE and /WR1. Control signal /WR1 is activated to attain L-level for a predetermined period, during which column select line CSL in the selected column is to be active, in the data write operation. For a period other than the above, control signal /WR1 is inactive and at H-level. Control signal /RE is activated to attain L-level for a predetermined period in the data read operation, and is kept inactive (H-level) for the period other than the above.

Logic gate 208 applies results of logical OR between the output of logic gate 206 and the output of decode unit CDU1 to each of the gates of P-channel MOS transistors 201 and 203 and N-channel MOS transistor 204. P-channel MOS transistor 200 receives an inverted signal of control signal /WE on its gate, and P-channel MOS transistor 202 receives control signal /WE on its gate.

P-channel MOS transistor 202 is designed to have a current drive power smaller than that of P-channel MOS transistor 200. For example, P-channel MOS transistor 202 is designed to have a smaller gate width than transistor 200 so that the above characteristics are achieved.

According to the above structure, an inverter formed of P- and N-channel MOS transistors 203 and 204, which are supplied with an operation current I1 from turned-on P-channel MOS transistor 202, drives column select line CSL1 in accordance with the output of logic gate 208 in the data write operation.

More specifically, when the output of decode unit CDU1 is active and at L-level, i.e., when the memory cell column in the first position is selected, column select line CSL1 is driven to H-level (power supply voltage Vcc2) in response to the active period (L-level) of control signal /WR1. Column select line CSL in the unselected column is driven to ground voltage Vss.

In the data read operation, an inverter formed of P- and N-channel MOS transistors 201 and 204, which are supplied with an operation current I2 (I2>I1) from turned-on P-channel MOS transistor 200, drives column select line CSL1 in accordance with the output of logic gate 208. Therefore, selected column select line CSL1 is driven to H-level (power supply voltage Vcc2) in response to the active period (L-level) of control signal /RE.

As described above, decode unit CDU1 outputs the results of decoding in accordance with the same timing in both the data read operation and the data write operation, but active column select line CSL is driven by different drive powers (i.e., different amounts of supplied currents) in the data write operation and the data read operation, respectively. Therefore, the voltage on column select line CSL, which is activated in the data write operation, rises slowly, and has a large rising time constant. In the data read operation, the voltage on active column select line CSL rises fast, and thus has a small rising time constant.

Figure 12:
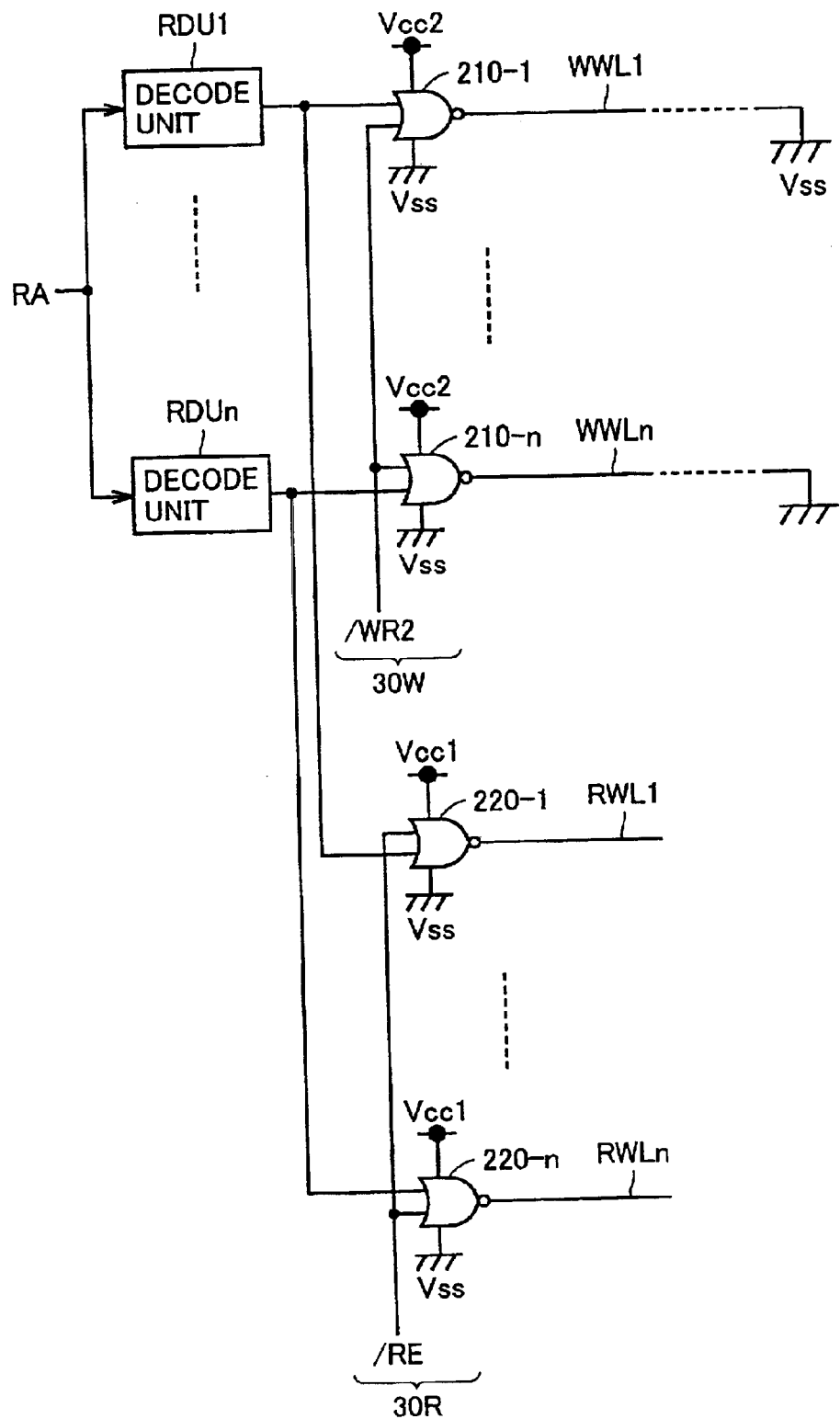
FIG. 12 is a circuit diagram showing a structure of a write word line driver.

Referring to FIG. 12, row decoder 20 has decode units RDU1–RDUn provided corresponding to the memory cell rows, respectively. Each of decode units RDU1–RDUn receives row address RA, and activates its output to attain L-level when the corresponding memory cell row is selected.

Word line driver 30 includes a write word line drive portion 30W for controlling activation of write word lines WWL1–WWLn, and a read word line drive portion 30R for controlling activation of read word lines RWL1–RWLn.

Write word line drive portion 30W includes drive gates 210-1–210-n provided corresponding to write word lines WWL1–WWLn, respectively. Each of drive gates 210-1–210-n is formed of an NOR gate receiving power supply voltage Vcc2 and ground voltage Vss for operation. Drive gate 210-1–210-n drive write word lines WWL1–WWLn in accordance with the outputs (results of decoding) of respective decode units RDU1–RDUn and control signal /WR2.

Control signal /WR2 is activated to attain L-level for a period corresponding to the period of the active state of write word line WWL in the selected row during the data write operation. For the period other than the above, control signal /WR2 is inactive and at H-level. Control signals /WR1, /WR2 and /RE are produced, e.g., by control circuit 5. When starting the data write operation, control signals /WR1 and /WR2 are activated (change from H-level to L-level) in accordance with the same timing. However, when ending the data write operation, control signal /WR2 is inactivated (changes from L-level to H-level), and thereafter control signal /WR1 is inactivated.

Thereby, write word line WWL corresponding to the selected row is driven to power supply voltage Vcc2 (H-level) for passing data write current Ip for a period of the L-level of control signal /WR2. However, write word lines WWL in the unselected rows are kept at ground voltage Vss (L-level). For periods including the period of the data read operation but not including the data write operation, control signal /WE is set to H-level, and each write word line WWL is inactive, and is set to ground voltage Vss.

Read word line drive portion 30R includes drive gates 220-1–220-n provided corresponding to read word lines RWL1–RWLn, respectively. Each of drive gates 220-1–220-n is formed of an NOR gate receiving power supply voltage Vcc1 and ground voltage Vss for operation. Drive gates 220-1–220-n drive read word lines RWL1–RWLn in accordance with the outputs (results of decoding) of respective decode units RDU1–RDUn and control signal /RE.

In the data read operation performed with control signal /RE at L-level, read word line RWL corresponding to the selected row is driven to H-level (power supply voltage Vcc1) for turning on access transistor ATR. Read word lines RWL in the unselected rows are kept at ground voltage Vss (L-level). For periods including the period of the data write operation but not including the data read operation, control signal /RE is set to H-level, and each read word line RWL is inactive, and is set to ground voltage Vss.

Although not shown in FIG. 12, decode units and drive gates similar to those for read word lines RWL are arranged for dummy read word lines DRWL1 and DRWL2.

Figure 13:
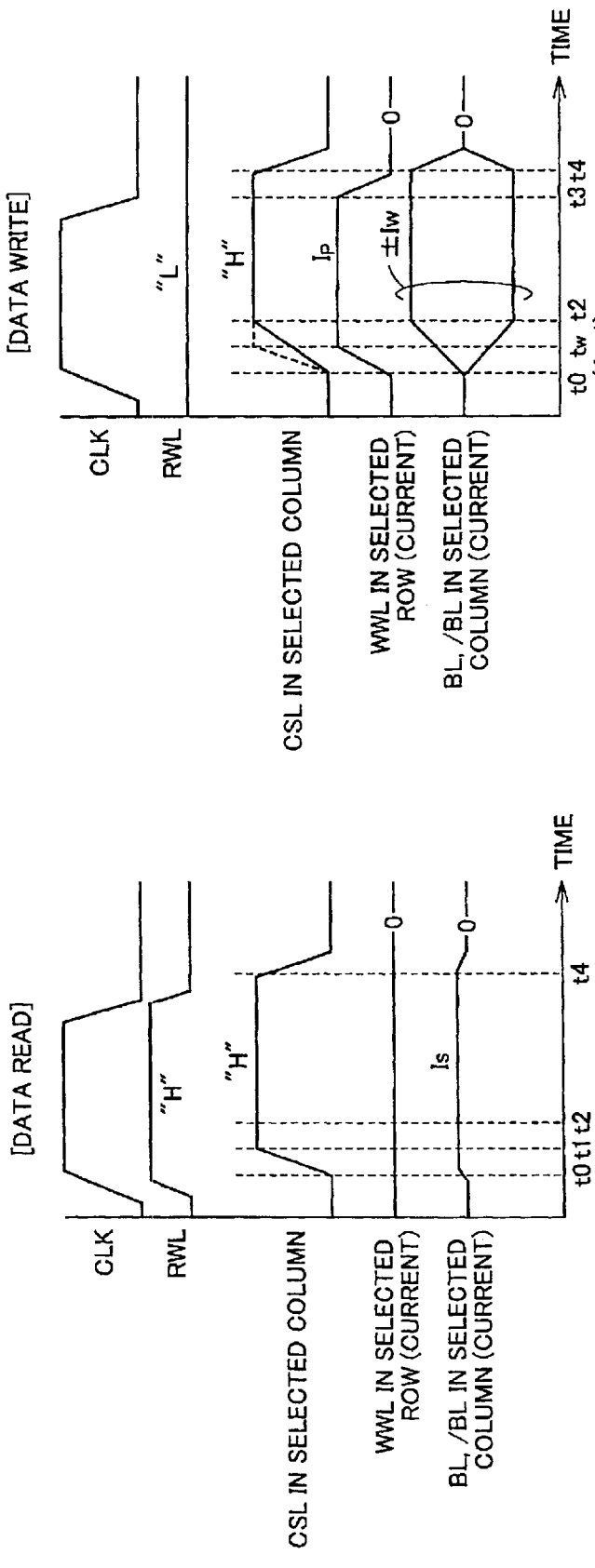
FIG. 13A is an operation waveform diagram representing a data read operation according to the second embodiment.
FIG. 13B is an operation waveform diagram representing a data write operation according to the second embodiment.

FIGS. 13A and 13B are operation waveform diagrams representing the data read operation and the data write operation according to the second embodiment, respectively.

Referring to FIG. 13A, the data read operation starts in response to a read command applied in accordance with the activation timing of clock signal CLK.

When the data read operation starts, read word line RWL in the selected row and column select line CSL in the selected column are activated in response to supplied row address RA and column address CA. The order of activation of read word line RWL and column select line CSL is not particularly restricted, and these lines are activated in accordance with the fastest timing for achieving fast access.

In particular, each of drive units DVU1–DVUm in column decoder 25 drives column select line CSL by P-channel MOS transistor 200 (FIG. 11) having a large drive current. Therefore, when the decode unit sends the results of decoding at a time t0, column select line CSL in the selected column rises from L-level to H-level at a time t1.

In the data read operation, each write word line WWL is kept at the level of ground voltage Vss so that the data write current does not flow therethrough. For bit lines BL and /BL in the selected column, constant sense current Is is supplied for the active period of column select line CSL. Sense current Is passes through the tunneling magneto-resistance element in the selected memory cell via the access transistor, which is turned on in response to the activation of read word line RWL. Thereby, the change in voltage already described with reference to FIG. 3 occurs so that the storage data can be read from the selected memory cell.

When ending the data read operation, column select line CSL in the selected column is inactivated at a time t4. In response to this, supply of sense current Is to bit lines BL and /BL in the selected column ends.

Referring to FIG. 13B, the write command is applied in accordance with the activation timing of clock signal CLK to start the data write operation, similarly to the data read operation.

When the data write operation starts, write word line WWL in the selected row is activated to carry data write current Ip in accordance with applied row address RA. Data write current Ip reaches a predetermined level at a time tw.

Column select line CSL in the selected column is slowly driven by P-channel MOS transistor 202 (FIG. 11) having a small current drive power. Therefore, the rising time constant of column select line CSL in the data write operation is set to be larger than that in the data read operation. More specifically, when the decode unit sends results of the decoding at time t0, column select line CSL rises from L-level to H-level at a time t2 later than time t1. In FIG. 13A, an operation waveform of the column select line in the selected column during the data reading is depicted by dotted line for comparison.

Thereby, data write currents ±Iw flowing through bit lines BL and /BL in the selected column start to flow slowly in accordance with the drive speed of column select line CSL when starting the data write operation. More specifically, data write currents ±Iw flowing through bit lines BL and /BL in the selected column reach the predetermined levels at time t2 later than time tw, at which data write current Ip reaches the predetermined level. In other words, the drive power of column select line CSL in the data write operation, i.e., operation current I1 shown in FIG. 11 is designed such that column select line CSL can be activated in accordance with the above timing.

Owing to the above structure, the data write magnetic field in the direction of the easy axis can be applied to the tunneling magneto-resistance element in the selected memory cell after applying the data write magnetic field in the direction of the hard axis when starting the data write operation.

When the data write operation is to be ended, write word line WWL in the selected row is inactivated at time t3 before time t4, at which column select line CSL in the selected column is inactivated, and thus supply of data write currents ±Iw to bit lines BL and /BL in the selected column ends. Thereby, supply of data write current Ip ends. More specifically, the timing of inactivatation of control signal /WR1 shown in FIG. 11 is set in accordance with time t4, and the timing of inactivatation of control signal /WR2 shown in FIG. 12 is set in accordance with time t3. The timing of activation of each of control signals /WR1 and /WR2 is set in accordance with time t0.

Thereby, at the end of the data write operation, such a period can be provided that the data write magnetic field is kept at a predetermined level in the direction of the easy axis, and the data write magnetic field in the direction of the hard axis decreases.

Figure 14:
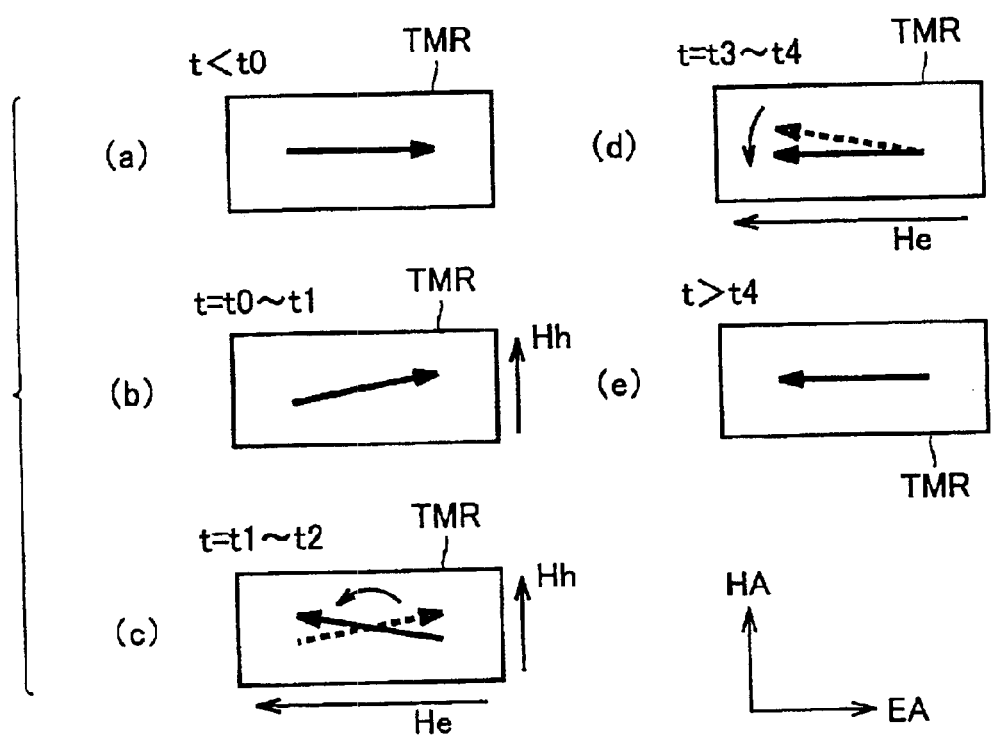
FIG. 14 conceptually shows magnetization behavior of the tunneling magneto-resistance element in the data write operation according to the second embodiment.

FIG. 14 conceptually shows a behavior of the tunneling magneto-resistance element in the data write operation according to the second embodiment.

Referring to (a) in FIG. 14, the free magnetic layer in the tunneling magneto-resistance element is magnetized in a certain direction (rightward at (a) in FIG. 14) along the easy axis before time t0 of start of the data write operation (t<t0). Description will now be given on the data write operation, in which the magnetization direction at (a) in FIG. 14 is rewritten to the opposite direction.

Referring to (b) in FIG. 14, data write current Ip flowing through write word line WWL applies a data write magnetic field Hh along hard axis (HA) for a period (t=t0–t1) from time t0 to time t1. Thereby, the magnetization direction of the free magnetic layer starts to rotate slowly.

For a period (t=t1–t2) from time t1 to time t2, as shown at (c) in FIG. 14, data write magnetic field Hh at a predetermined level is kept in the direction of the hard axis, and further data write magnetic field He in the direction of the easy axis is applied for inverting the magnetization direction of the free magnetic layer. When the sum of data write magnetic fields Hh and He reaches a region outside the asteroid characteristic line shown in FIG. 29, the direction of magnetization of the free magnetic layer is rewritten from the direction indicated by an arrow with dotted line to the direction indicated by an arrow with solid line.

For a period (t=t3–t4) from time t3 to time t4, as shown at (d) in FIG. 14, data write magnetic field He at a predetermined level is kept in the direction of the easy axis, and data write magnetic field Hh in the direction of the hard axis decreases. Thereby, a vectorial sum of data write magnetic fields Hh and He changes and turns its direction as shown at (c) in FIG. 14 when the data write operation ends.

As indicated at (e) in FIG. 14, by changing data write magnetic fields Hh and He in the above order, the magnetization direction of the free magnetic layer is stably rewritten to the opposite direction in the data write operation without entering an undesirable intermediate magnetization state.

Figure 15:
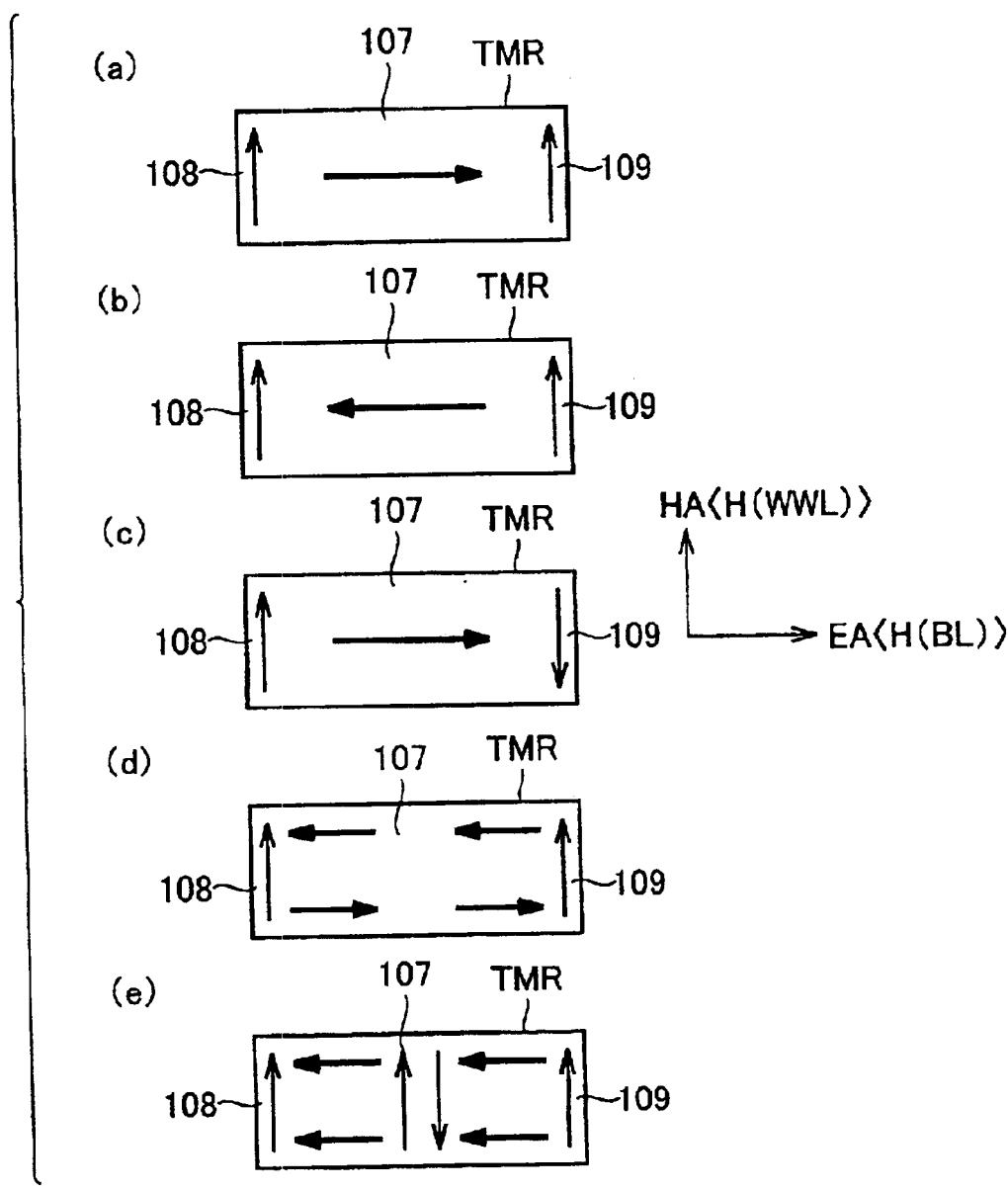
FIG. 15 shows occurrence of an undesired intermediate magnetization state occurring in a free magnetic layer during data writing.

Referring to FIG. 15, description will now be given on the undesirable intermediate magnetization state of the free magnetic layer in the data write operation.

Referring to FIG. 15, end regions 108 and 109 of tunneling magneto-resistance element TMR have such characteristics that these regions are not easily magnetized in response to the magnetic field along the easy axis, and the direction and amount (degree) of the magnetization gradually change. Therefore, the end regions have characteristics, which are undesirable for the memory cell, in contrast to a central region 107, in which the direction and amount of magnetization are determined in a binary manner in response to the magnetic field along the easy axis.

In the free magnetic layer of tunneling magneto-resistance element TMR, as shown at (a) and (b) in FIG. 15, the central region is magnetized along the easy axis and particularly in the direction depending on the level of write data after magnetizing end regions 108 and 109 in one direction along the hard axis, whereby the free magnetic layer can have stable magnetization characteristics.

As described above, the activation of column select line CSL can be delayed from the activation of write word line WWL, whereby the data write magnetic field in the direction of the hard axis is applied prior to the data write magnetic field in the direction of the easy axis. Thereby, the magnetization directions in end regions 108 and 109 of tunneling magneto-resistance element TMR can be set to a uniform direction (upward at (a) and (b) in FIG. 15), and thereafter magnetization in the direction of the easy axis can be inverted stably in central region 107.

In contrast to the above, if column select line CSL is activated substantially simultaneously with or prior to write word line WWL, the free magnetic layer enters a multistable state, and is magnetized in irregular directions causing the intermediate state other than the desired stable state, as shown at (c), (d) and (e) in FIG. 15.

As a result, the magnetization direction of the free magnetic layer and cannot be uniform after the data writing, and do not attain the desired state shown at (a) or (b) in FIG. 15. Therefore, a desired electric resistance difference corresponding to the difference in level of the storage data cannot be ensured in the memory cell holding the written data. This causes a malfunction, and impairs the operation stability of the MRAM device.

As already described, by supplying the data write current in accordance with the second embodiment, the data write magnetic field in the direction of the hard axis can be produced or removed more rapidly than the data write magnetic field in the easy axis when starting and ending the data write operation. Thereby, the data writing can be stably executed in view of the magnetization characteristics of the MTJ memory cell.

The drive power of column select line CSL corresponding to the selected column can be switched between those for the data read operation and the data write operation. Thereby, column select line CSL corresponding to the selected column can be activated fast in accordance with earliest timing in the data read operation so that the operation speed can be increased. Also, in the data write operation, the data writing can be stably executed while avoiding the magnetically unstable intermediate state. Thus, both the stable data writing and the fast data reading can be achieved.

Although the tunneling magneto-resistance element shown in FIGS. 14 and 15 has a rectangular form, the tunneling magneto-resistance element may have a chamfered form as already described in connection with the first embodiment. Even in this case, the magnetization behavior in the data write operation is the same as that already described.

Memory array 10 may employ a structure other than that shown in FIG. 7 for supplying the data write current according to the second embodiment. For example, the second embodiment may be employed in a memory array of a structure shown in FIG. 16, in which each write word line WWL is not electrically coupled to the MTJ memory cell, but access transistor ATR and tunneling magneto-resistance element TMR are connected in series between bit line BL and ground voltage Vss supply node.

The data reading and data writing can be performed similarly in such a structure that column select lines CSL dedicated to writing are employed independently of column select lines CSL dedicated to reading.

Third Embodiment

A third embodiment will now be described in connection with a structure for applying a page mode operation, which is used in a conventional dynamic random access memory, to an MRAM device.

Figure 17:
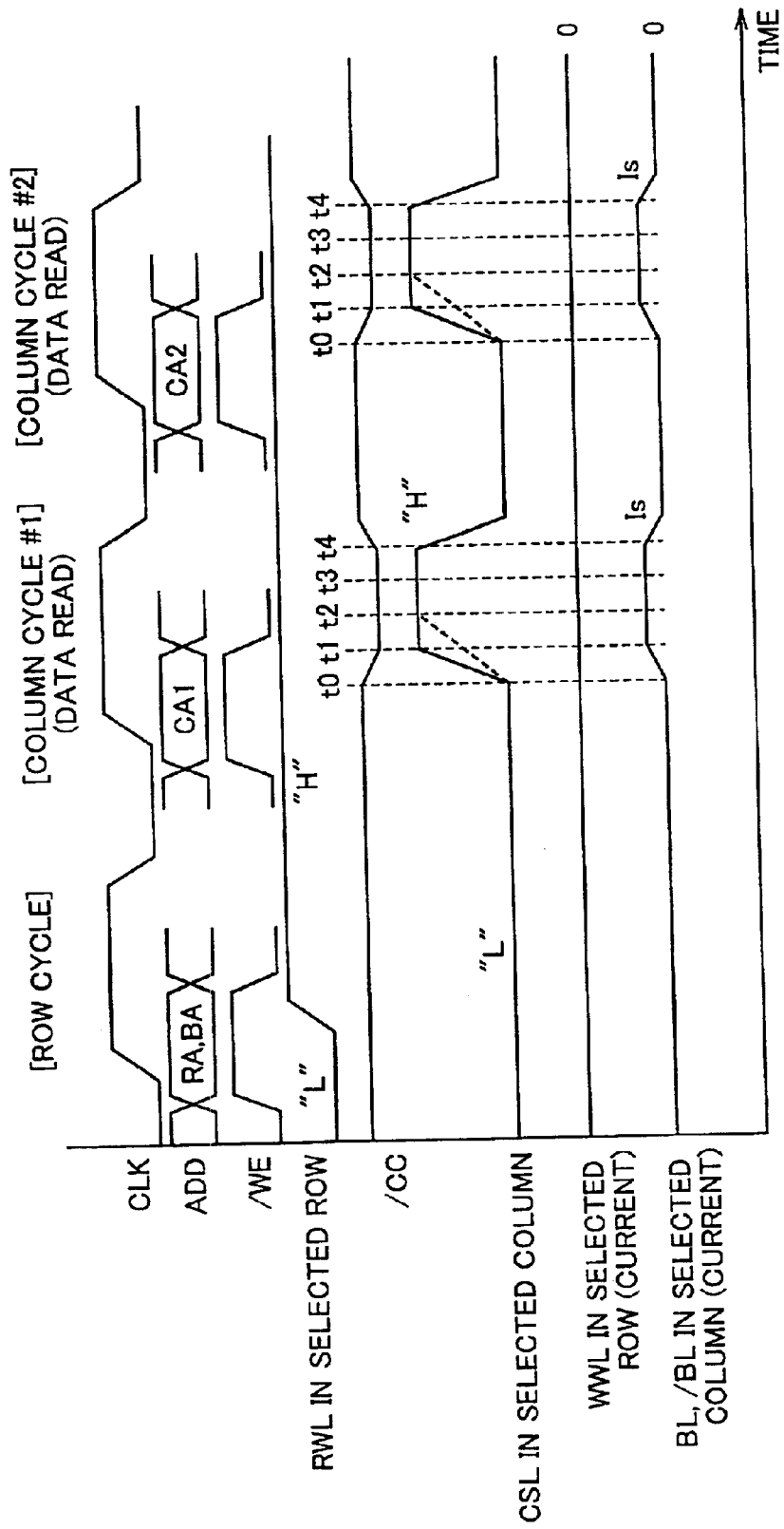
FIG. 17 is an operation waveform diagram representing a page mode operation for continuously executing data reading.

FIG. 17 is an operation waveform diagram representing a page mode operation for continuously executing the data reading.

Referring to FIG. 17, one unit operation cycle of the page mode operation includes a row cycle for receiving a row address used for the row selection, and a plurality of column cycles for continuously accessing a plurality of columns while maintaining the row selection performed in the row cycle. In each column cycle, the data read operation or data write operation is instructed, and a column address indicating the target of data reading or data writing is input.

Each of the row and column cycles starts in response to clock signal CLK. In the row cycle, row address RA for executing the row selection is input. For example, memory array 10 is divided into a plurality of banks, and a bank address BA is further input together with row address RA when the bank selection is further required for specifying the selected row.

In response to the level of control signal /WE, which is input in the row cycle, it is determined which operation between data reading and data writing is to be executed in the subsequent column cycles. In FIG. 17, since control signal /WE is at H-level when clock signal CLK becomes active in the row cycle, the data read operation is executed in each of the subsequent column cycles. In each column cycle, a column cycle signal /CC is activated to attain L-level for a predetermined period based on clock signal CLK.

In an example of operation shown in FIG. 17, the data reading is continuously performed in the column cycles. In the row cycle, read word line RWL in the selected row is activated to change its level from L-level to H-level in response to row address RA (and bank address BA). Activation of read word line RWL in the selected row is kept within the same unit operation cycle.

In a column cycle #1, control signal /WE is set to H-level for a predetermined period. Further, a column address CA1 representing the data read target is input. In response to column address CA1, column select line CSL in the selected column is activated in accordance with timing similar to that shown in FIG. 13A. In response to this, bit line BL in the selected column carries sense current Is to be passed through the tunneling magneto-resistance element in the selected memory cell. Thereby, storage data can be read from the selected memory cell corresponding to row address RA (and bank address BA) and column address CA1.

In a column cycle #2, data is likewise read from the selected memory cell corresponding to column address CA2 and row address RA (and bank address BA).

Figure 18:
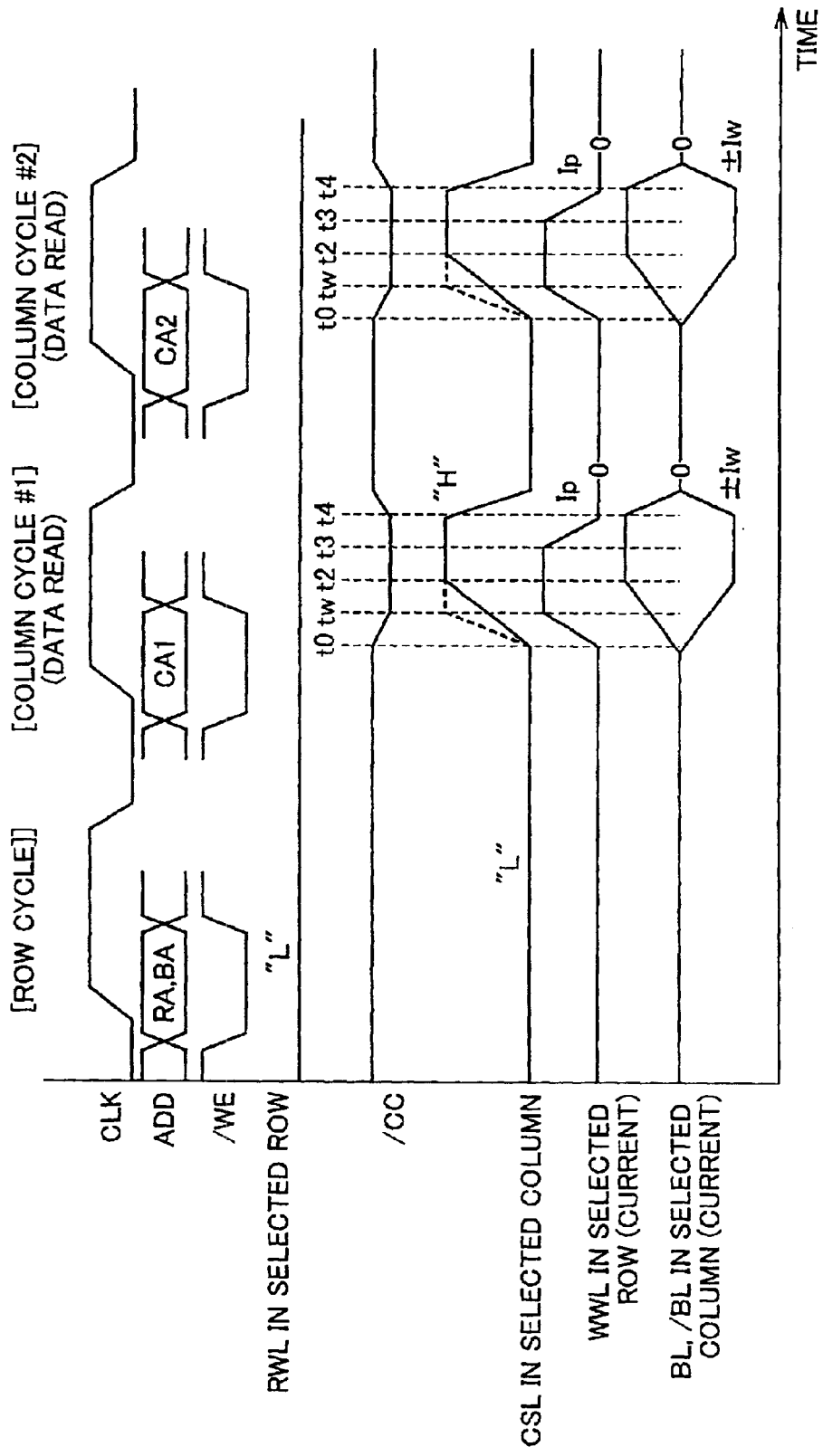
FIG. 18 is an operation waveform diagram showing a page mode operation for continuously executing data writing.

FIG. 18 is an operation waveform diagram representing the page mode operation for continuously executing the data writing.

Referring to FIG. 18, when the data write operation is continuously executed in the column cycles, control signal /WE is set to L-level in the row cycle. In response to this, each read word line RWL is kept in an inactive state (L-level of ground voltage Vss) in the row cycle and each of the subsequent column cycles. The results of row selection, which is performed in response to row address RA (and bank address BA) applied in the row cycle, are held in the same unit operation cycle.

In each column cycle for executing the data writing, control signal /WE is set to L-level for a predetermined period. Activation of write word line WWL in the selected row, which corresponds to row address RA (and bank address BA) applied in the row cycle, is controlled in each column cycle.

For example, column cycle signal /CC and a delayed signal of control signal /WE are used, and write word line WWL in the selected row is activated to carry data write current Ip for a predetermined period (from time t0 to time t4 in FIG. 18) in column cycle #1 including execution of the data write operation. In periods other than the above, write word line WWL in the selected row is inactivated, and supply of the data write current ends. More specifically, when the row cycle and each column cycle end, each write word line WWL is inactivated, and supply of data write current Ip temporarily stops.

Thereby, it is possible to reduce the possibility of erroneous data writing in the unit operation cycle of the page mode operation, as compared with the structure maintaining the activation of write word line WWL in the selected row. In other words, if the activation of the write word line in the selected row were maintained, the magnetic field at the predetermined level in the direction of the hard axis would be continuously applied to each MTJ memory cell in the selected row. This would result in a possibility that erroneous data writing is caused even by magnetic noises of a smaller intensity.

In column cycle #1, column address CA1 is input as address signal ADD in accordance with the timing of activation of clock signal CLK, and control signal /WE is set to L-level. Thereby, activation of column select line CSL corresponding to column address /CA1 and supply of data write current Ip for write word line WWL are executed in accordance with the timing similar to that already described with reference to FIG. 17. Therefore, the data write operation in column cycle #1 is performed similarly to that in FIG. 13B, and the data write magnetic field in the direction of the hard axis can be produced or removed more rapidly than the data write magnetic field in the direction of the easy axis when the data write operation starts or ends. Thereby, the data writing can be stably executed with consideration given to the magnetization characteristics of the MTJ memory cell.

Figure 19:
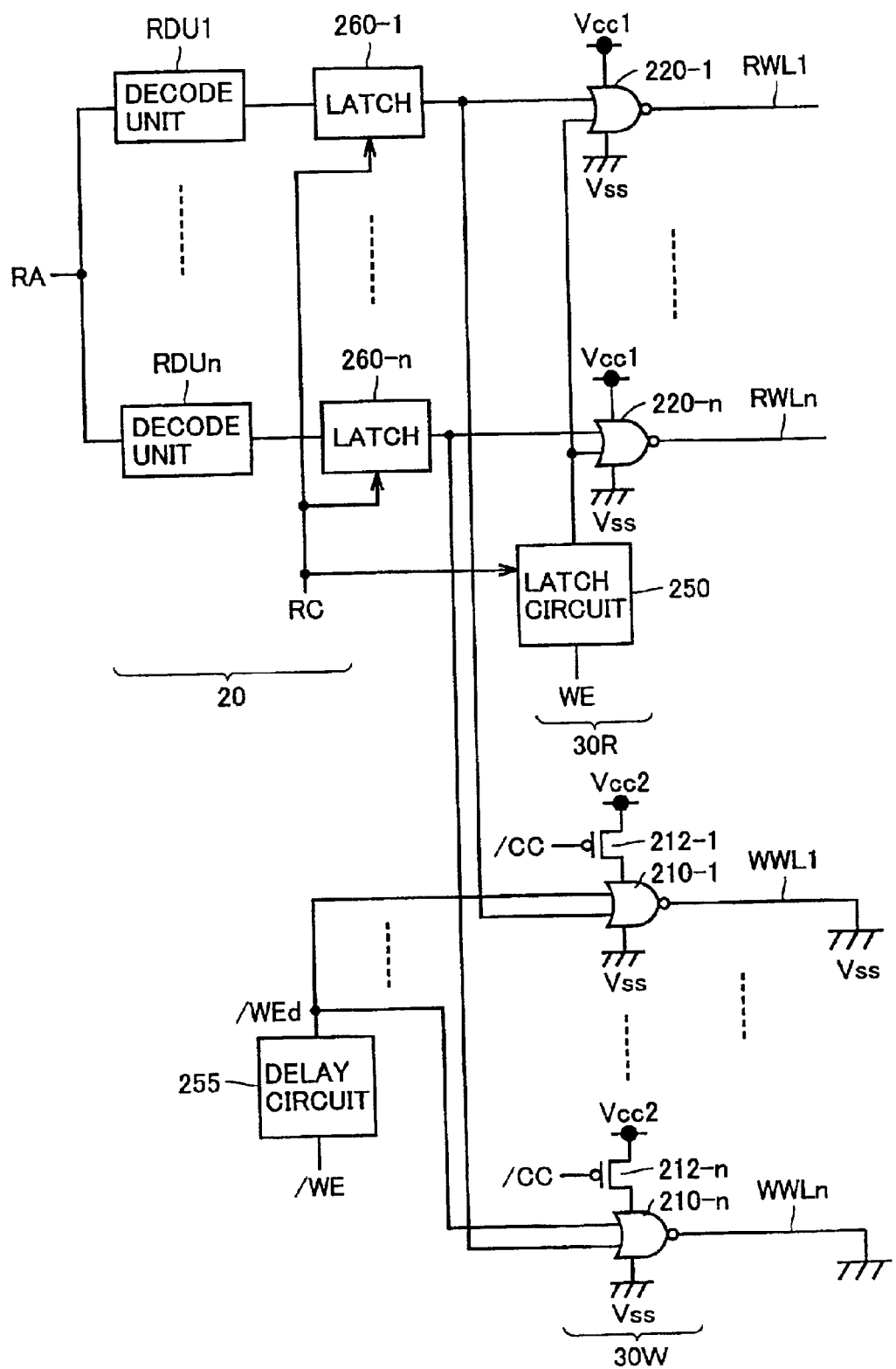
FIG. 19 is a circuit diagram showing a structure of a word line driver according to a third embodiment.

Referring to FIG. 19, word line driver 30 according to the third embodiment includes latch circuits 260-1–260-n for latching results of decoding of decode units RDU1–RDUn, read word line drive portion 30R and write word line drive portion 30W.

Latch circuits 260-1–260-n latch outputs (results of decoding) of decode units RDU1–RDUn in response to control signal RC, which becomes active in accordance with predetermined timing in the row cycle. Thereby, latch circuits 260-1–260-n hold the results of row selection corresponding to row address RA (and bank address BA), which is applied in the row cycle, within the same unit operation cycle.

Read word line drive portion 30R further has a latch circuit 250 in addition to drive gates 220-1–220-n shown in FIG. 12. Latch circuit 250 holds the signal level of control signal WE (i.e., inverted signal of /WE), which is applied in the row cycle, in response to control signal RC.

Contents held in latch circuit 250 and each of latch circuits 260-1–260-n are renewed in every row cycle within a new unit operation cycle.

Each of drive gates 220-1–220-n controls activation of corresponding read word line RWL in response to results of row selection held in corresponding one of latch circuits 260-1–260-n and control signal WE held in latch circuit 250. As already described with reference to FIGS. 17 and 18, therefore, the inactive state (L-level) of each read word line RWL is maintained in the current row cycle and the subsequent column cycle when control signal /WE is set to L-level (WE="H") in the row cycle.

When control signal /WE is set to H-level in the row cycle, the active state (H-level) of read word line RWL in the selected row is maintained in the current row cycle and the subsequent column cycle. Control of the activation of read word line RWL is changed in response to control signal RC in every new row cycle. Although not shown in FIG. 19, similar structures are employed for dummy read word lines DRWL1 and DRWL2.

Write word line drive portion 30W according to the third embodiment differs from the write word line drive portion shown in FIG. 12 in that switch transistors 212-1–212-n and a delay circuit 255 are further employed.

Delay circuit 255 delays control signal /WE by a predetermined time to output a control signal /WEd. Further, switch transistors 212-1–212-n supply an operation current to drive gates 210-1–210-n in response to column cycle signal /CC shown in FIGS. 17 and 18, respectively.

Each of drive gates 210-1–210-n controls activation of corresponding write word line WWL in response to results of the row selection held in corresponding one of latch circuits 260-1–260-n, which are commonly used by read word line drive portion 30R, and control signal /WEd sent from delay circuit 255. The delay time in delay circuit 255 is determined in view of the preferable supply timing of data write current Ip, i.e., times t0 and t3 shown in FIG. 18.

Owing to the above structure, activation of write and read word lines WWL and RWL can be controlled in accordance with the appropriate timing for executing the page mode operation shown in FIGS. 17 and 18. For column select line CSL, the activation control can be performed by the column decoder, which has a structure similar to that of the second embodiment.

According to the structure of the third embodiment, as described above, both the fast data reading and the stable data writing performed with consideration given to the magnetization characteristics of the MTJ memory cell can be performed in the page mode operation for continuously executing either the data read operation or the data write operation.

First Modification of Third Embodiment

Figure 20:
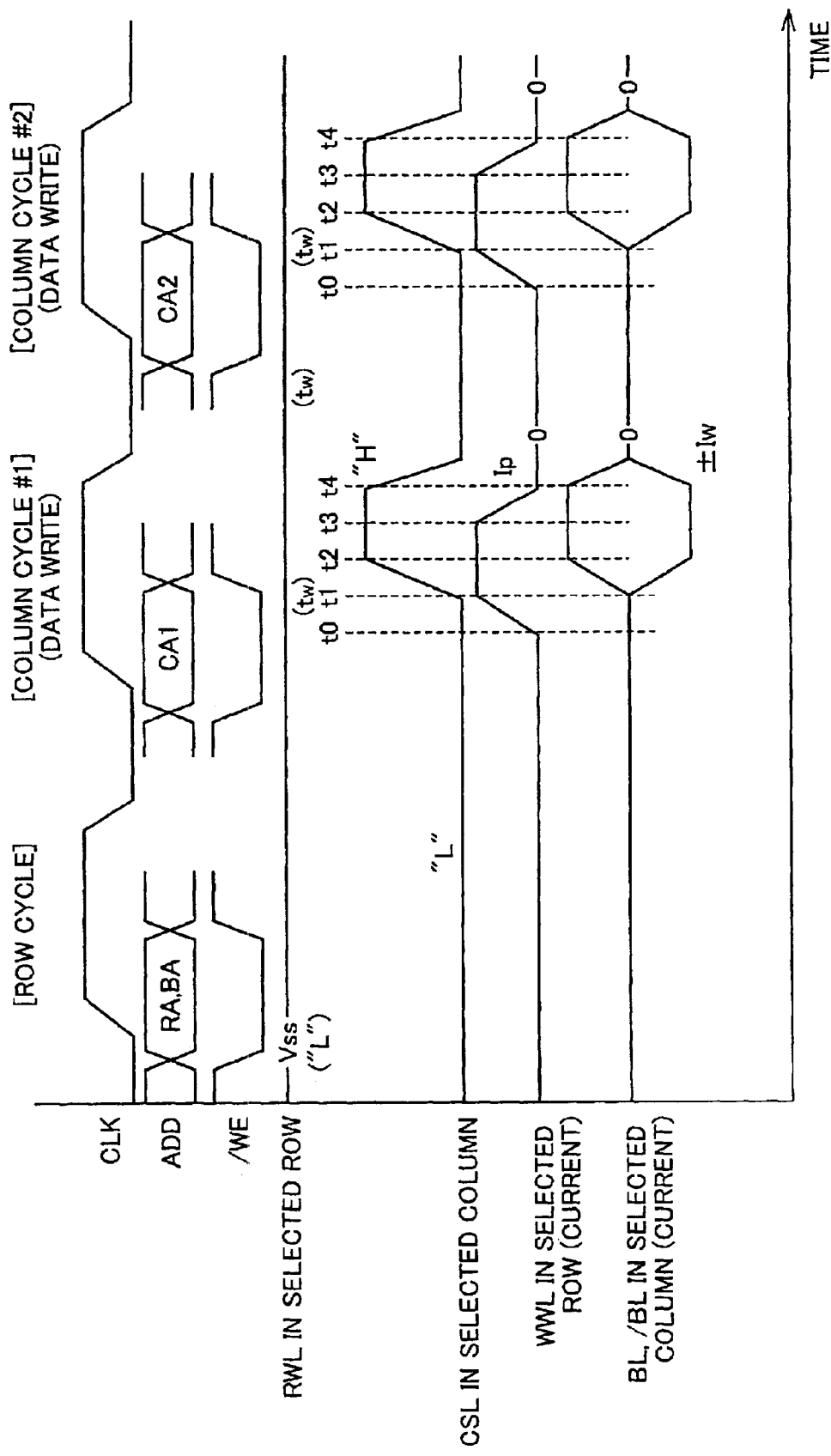
FIG. 20 is an operation waveform diagram representing a data write operation in a page mode operation according to a first modification of the third embodiment.

In a page mode operation according to a first modification of the third embodiment, as shown in FIG. 20, the word line driver shown in FIG. 19 controls activation of write and read word lines WWL and RWL, whereby supply timing of data write current Ip is set similarly to the timing shown in FIG. 18.

The page mode operation according to the first modification of the third embodiment shown in FIG. 20 differs from that shown in FIG. 18 in that the activation of column select line CSL in the selected column is delayed in each column cycle including instruction of the data writing. More specifically, supply of data write currents ±Iw for producing the data write magnetic field in the direction of the easy axis starts at time tw, and the level thereof increases to a predetermined level at time t2.

When the data write operation ends, the time of inactivatation of column select line CSL is set to time t4 later than time t3, which is the time of inactivatation of write word line WWL.

The data write operation in a subsequent column cycle #2 is executed on the selected memory cell, which corresponds to column address CA2 applied in the same column cycle and row address RA (and bank address BA) applied in the row cycle, similarly to column cycle #1.

According to the above data write operation, and particularly in the column cycle for executing the data writing, supply of data write currents ±Iw for producing the data write magnetic field in the direction of the easy axis starts and ends in accordance with the timing delayed from the start and end of supply of data write current Ip for producing the data write magnetic field in the direction of the hard axis.

Figure 21:
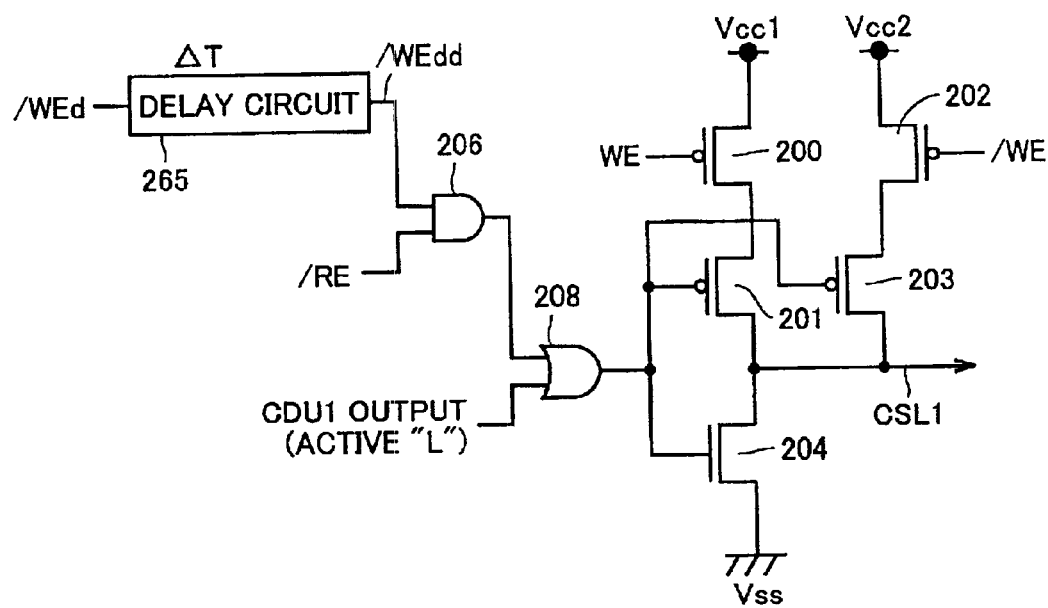
FIG. 21 is a circuit diagram showing a structure of a drive unit of a column select line CSL according to the first modification of the third embodiment.

As already described, the drive units provided for the respective column select lines have the same structure, and therefore, FIG. 21 representatively shows a structure of drive unit DVU1 corresponding to column select line CSL1.

Referring to FIG. 21, drive unit DVU1 according to the first modification of the third embodiment differs from the structure of the drive unit shown in FIG. 11 in that a delay circuit 265 is further employed.

Delay circuit 265 further delays control signal /WEd sent from delay circuit 255 shown in FIG. 20 by a predetermined time $\Delta T$ to output a control signal /WEdd. Control gate 206 outputs results of logical AND between control signals /RE and /WEdd. Control gate 208 applies results of logical OR between the outputs of decode unit CDU1 and logical gate 206 to each of the gates of P- and N-channel MOS transistors 201 and 204, similarly to the structure shown in FIG. 11.

In the structure shown in FIG. 21, the current drive power of P-channel MOS transistor 202 is designed similarly to the current drive power (operation current I2 in FIG. 11) of P-channel MOS transistor 200. Therefore, the drive power (amount of current supply) of column select line CSL, which is active in the data write operation, is set similarly to that in the data read operation. Accordingly, the rising rate of voltage on active column select line CSL, and thus the rising time constant are substantially uniform in each of the data write operation and data read operation.

In each column cycle including instruction of the data write operation, column select line CSL in the selected column is rapidly activated to attain power supply voltage Vcc2, or is rapidly inactivated to attain ground voltage Vss in response to control signal /WEdd with a delay of time $\Delta T$ from activation or inactivatation of write word line WWL in the selected row. Predetermined time ΔT in delay circuit 265 is set in view of a difference between times t0 and tw in FIG. 20 and a difference between times t3 and t4 so that data write currents Ip and ±Iw can be supplied in accordance with the timing shown in FIG. 20. The delay times of delay circuits 255 and 265 may be appropriately determined so that both delay circuits 255 and 265 may use common control signal /WE.

In the data read operation, column select line CSL in the selected column is activated to H-level (power supply voltage Vcc1) in accordance with the fastest timing responsive to the activation (L-level) of control signal /RE.

Owing to the above structure, when the page mode operation is performed, the data write magnetic field in the direction of hard axis can likewise be produce or removed more rapidly than the data write magnetic field in the direction of the easy axis when the data write operation starts or ends in the column cycle, during which the data writing is executed. Thereby, similarly to the first modification of the third embodiment, the data writing can be stably executed with consideration given to magnetization characteristics of the MTJ memory cell.

Second Modification of Third Embodiment

A second modification of the third embodiment will now be described in connection with a page mode operation, which allows continuous execution of the data read operation and the data write operation in a mixed manner over a plurality of column cycles within one unit operation cycle.

Figure 22:
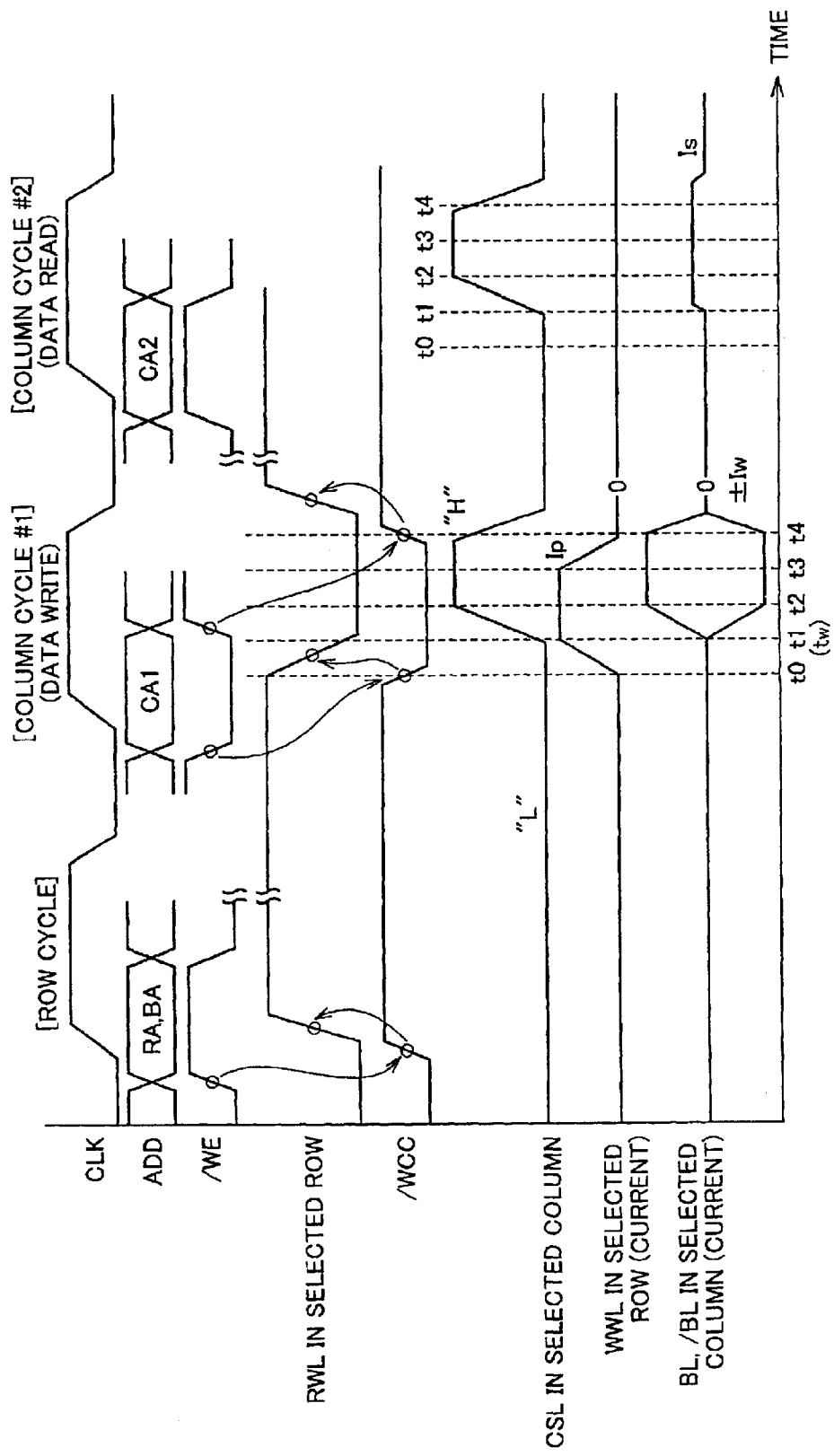
FIG. 22 is an operation waveform diagram showing a page mode operation according to a second modification of the third embodiment.

Referring to FIG. 22, when the unit operation cycle starts in the page mode operation according to the second modification of the third embodiment, the row cycle for receiving applied row address RA (and bank address BA) for row selection is first performed, similarly to the page mode operation according to the third embodiment and the first modification thereof. The results of row selection performed with row address RA (and bank address BA), which is input in this row cycle, are held in the same operation cycle. Based on the row selection results thus held, read word line RWL is activated to attain H-level except for the column cycle, in which the data write operation is instructed.

In each column cycle, control signal /WE is set to L-level for a predetermined period if the data write operation is instructed.

Figure 23:
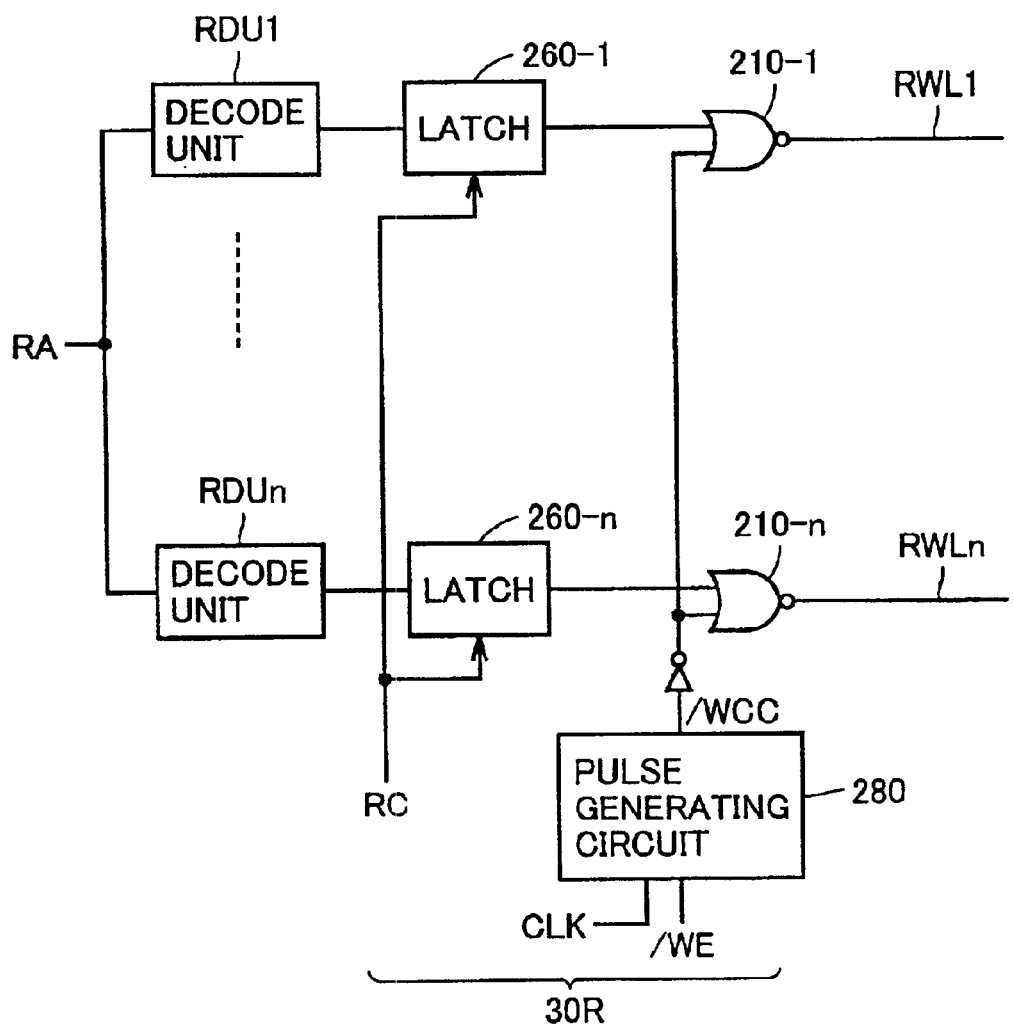
FIG. 23 is a circuit diagram showing a structure of a read word line driver portion 30R according to the second modification of the third embodiment.

Referring to FIG. 23, read word line drive portion 30R according to the second modification of the third embodiment differs from the read word line drive portion according to the third embodiment shown in FIG. 19 in that a pulse generating circuit 280 is employed instead of latch circuit 250. Pulse generating circuit 280 produces a control pulse /WCC for determining the active period of read word line RWL in accordance with the level of control signal /WE at the time of activation of clock signal CLK.

Referring to FIG. 22 again, when control signal /WE is at H-level at the time of activation of clock signal CLK in a certain cycle, control pulse /WCC is kept at H-level in the same cycle. In the column cycle including instruction of data writing, control signal /WE is set to L-level at the time of activation of clock signal CLK so that control pulse /WWC is kept at L-level for a predetermined period which corresponds to between times t0 and t4 in FIG. 22. This predetermined period depends on, e.g., the active period of control signal /WE.

Referring to FIG. 23 again, drive units 220-1–220-n control activation of corresponding read word lines RWL in response to the row selection results held in latch circuits 260-1–260-n and the inverted signal of control signal /WCC, respectively. Although not shown in FIG. 23, similar structures are employed for dummy read word lines DRWL1 and DRWL2.

Write word line drive portion 30W has structures similar to those shown in FIG. 19, and controls activation of write word line WWL in the selected row, which corresponds to row address RA (and bank address BA) applied in the row cycle, in every column cycle.

Owing to the above structure, read word line RWL in the selected row corresponding to the latch circuit, which holds L-level data, is activated to attain H-level during a period except for a predetermined period in the column cycle including the instruction of the data write operation. This increases the operation speed in each column cycle including the instruction of the data read operation.

In column cycles #1 and #2, which include instruction of the data write operation, each read word line RWL is inactivated, and the data write operation can be performed for the selected memory cell, which corresponds to applied column address CA1 or CA2 and row address RA (and bank address BA) applied during the row cycle, similarly to the third embodiment and the first modification thereof.

Figure 16:
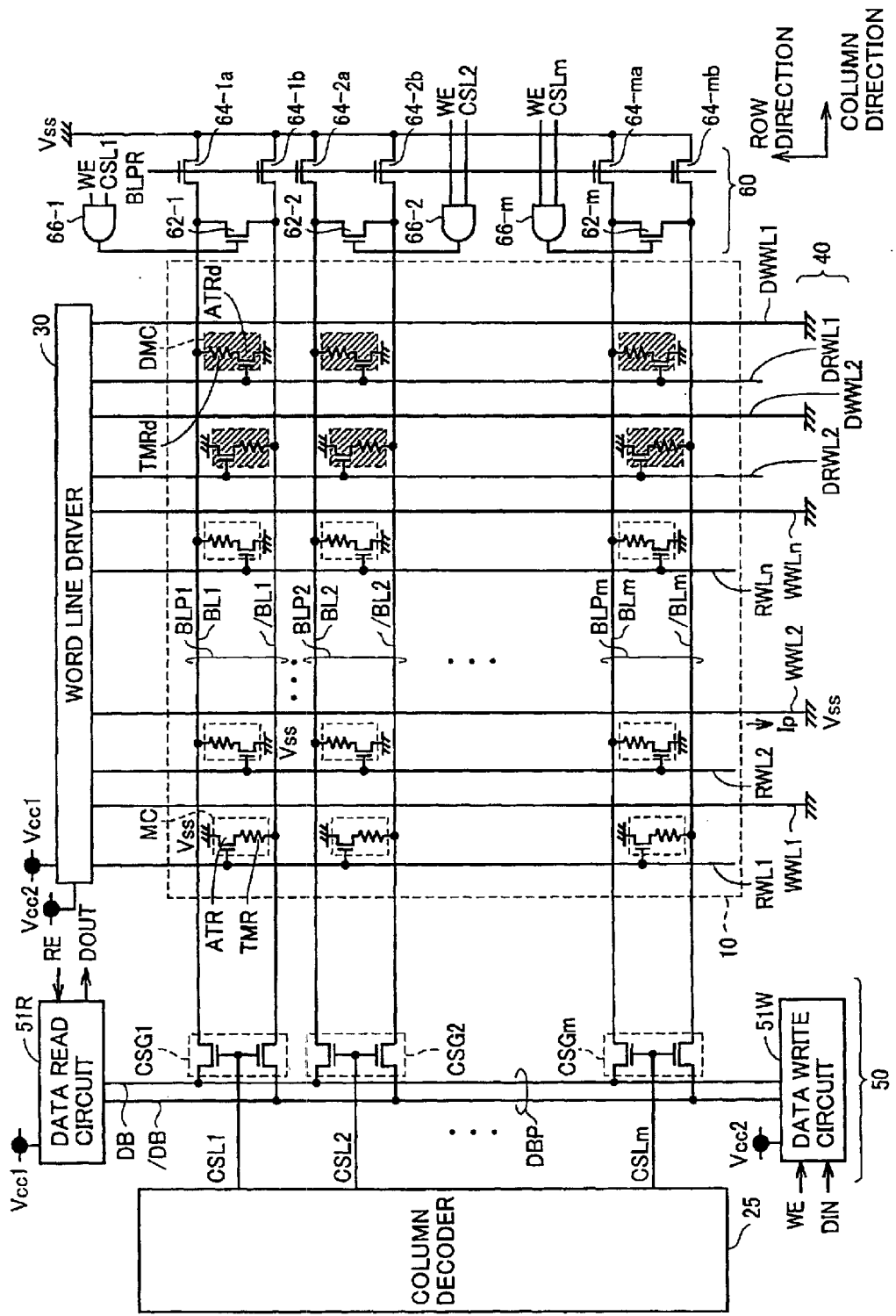
FIG. 16 is a circuit diagram showing another example of the structure of the memory array.

The activation timing of write word line WWL must be set in accordance with the structure of memory array 10. In the structure having write word lines WWL, which are electrically isolated from respective MTJ memory cells as shown in FIG. 16, no adverse effect occurs even if write word line WWL is supplied with the data write current while read word line RWL in the selected row is active. According to the above structure, therefore, such a design may be employed that read and write word lines RWL and WWL in the selected row are active for periods, which overlap with each other when data write operation starts.

In contrast to the above, the memory array shown in FIG. 7. has a structure, in which the current path including both tunneling magneto-resistance element TMR and write word line WWL is formed in response to turn-on of access transistor ATR. In this structure, erroneous data writing may occur if read and write word lines RWL and WWL in the selected row are active for time periods having overlapping portions. In this memory array structure, therefore, such setting or design is required that the active periods of read and write word lines RWL and WWL in the selected row do not overlap with each other.

In the structure according to the second modification of the third embodiment, therefore, both the fast data reading and the stable data reading, which is achieved in consideration of magnetization characteristics of the MTJ memory cell, can be executed in the page mode operation, which allows mixing of the data read operation and the data write operation.

Third Modification of Third Embodiment

A third modification of the third embodiment will now be described in connection with a structure for further increasing a speed of the data read operation in the page mode operation, which includes the data read operation and the data write operation in a mixed manner.

Figure 24:
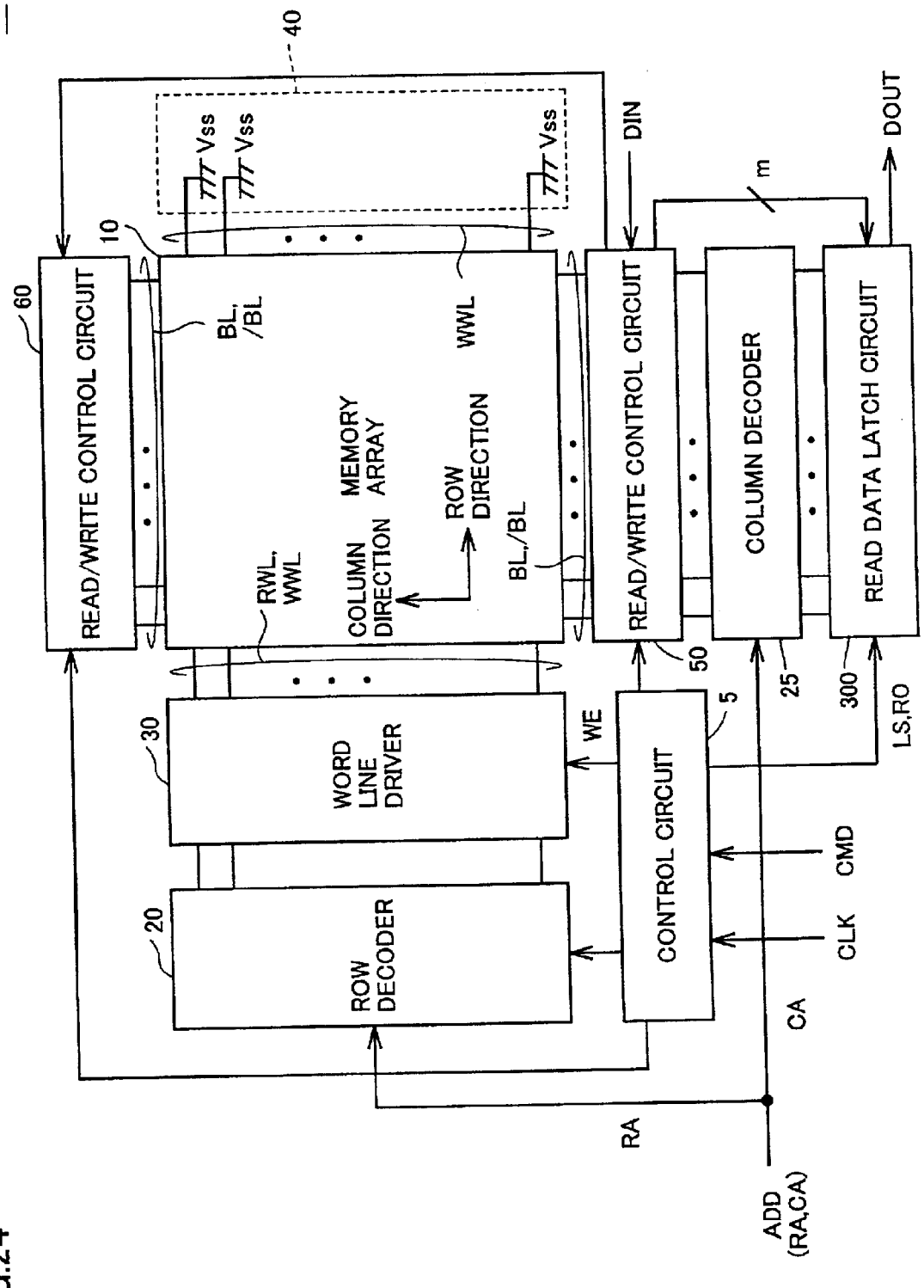
FIG. 24 is a whole block diagram showing a structure of an MRAM device according to a third modification of the third embodiment.

Referring to FIG. 24, an MRAM device 2 according to the third modification of the third embodiment differs from MRAM device 1 shown in FIG. 1 in that a read data latch circuit 300 is further employed.

Read data latch circuit 300 latches at least a portion of the data of m bits, which are read by read/write control circuit 50, in response to control signal LS produced by control circuit 5. Further, read data latch circuit 300 outputs, as read data DOUT, at least one among the plurality of internally latched storage data in accordance with control signal RO sent from the control circuit and results of the column selection of column decoder 25.

The structure for writing write data DIN into the selected memory cell within memory array 10 is substantially the same as those of the third embodiment and the first and second modifications hereof, and therefore description thereof is not repeated.

Figure 25:
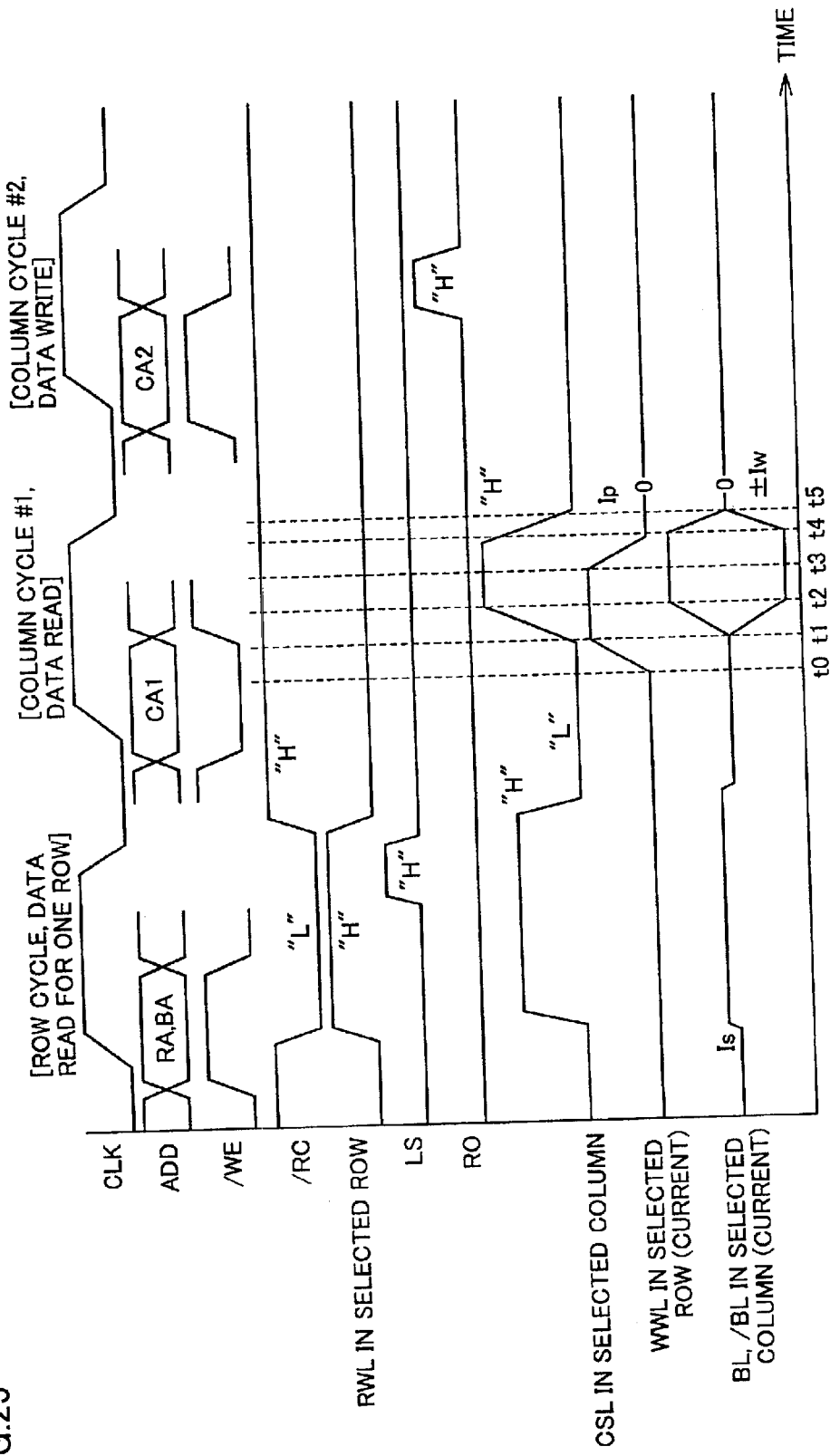
FIG. 25 is an operation waveform diagram representing a page mode operation of MRAM device according to the third modification of the third embodiment.
Figure 26:
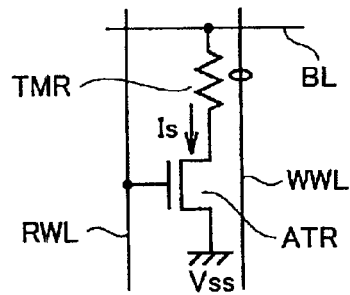
FIG. 26 conceptually shows a structure of an MTJ memory cell.
Figure 27:
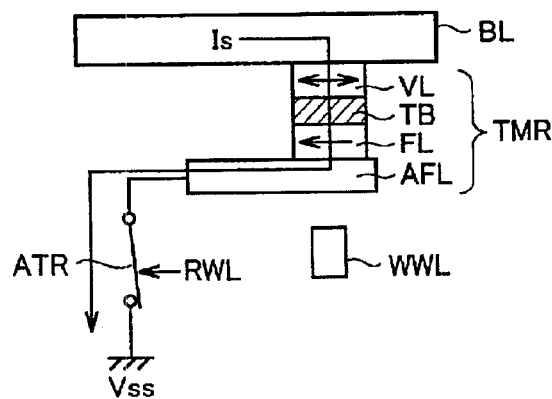
FIG. 27 conceptually shows an operation of reading data from the MTJ memory cell.
Figure 28:
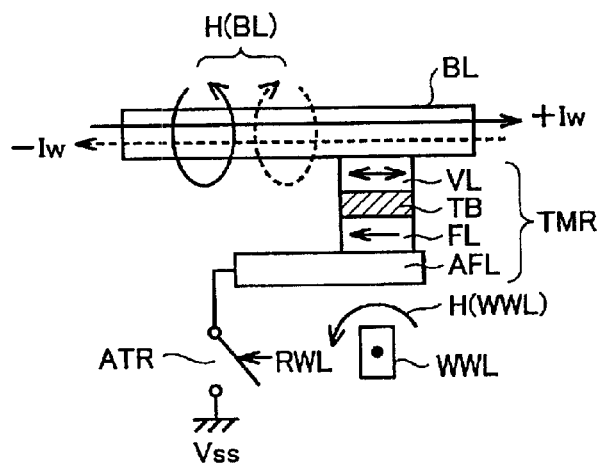
FIG. 28 conceptually shows an operation of writing data into the MTJ memory cell.

In the page mode operation according to the third modification of the third embodiment, as shown in FIG. 25, data reading for one row corresponding to the selected row indicated by input row address RA (and bank address BA) is executed during the row cycle. Thus, read word line drive portion 30R activates read word line RWL in the selected row in response to control signal /RC, which is activated to attain L-level for a predetermined period, during the row cycle.

In the row cycle, column select lines CSL of M (M: integer exceeding one and not exceeding m) in number corresponding to at least a part of all the memory cell columns are activated in parallel, and data reading is executed in parallel on the plurality of memory cells. In general, data reading is executed in all the memory cell columns, or is executed in the odd-numbered or even-numbered columns.

Read/write control circuit 50 is designed such that supply of the sense current Is and reading of the storage data can be performed in parallel for the M memory cell columns, which are simultaneously selected. For example, the structure for data read circuit 51R shown in FIG. 8 must be divided into M portions equal in number to the memory cell columns to be activated simultaneously. In the form of this modification, it is assumed that all the data for one row are read out in parallel, and thus M is equal to m.

In accordance with the timing of production of the m read data corresponding to the selected row by read/write control circuit 50, control circuit 5 activates control signal LS for a predetermined period. In response to this, read data latch circuit 300 latches the read storage data of m in number.

In the subsequent column cycle #1 including instruction of the data write operation, control signal /WE is set to L-level for a predetermined period including the activation of clock signal CLK. Further, column address CA1 for representing the data write target is input.

In response to this, data write currents ±Iw and Ip are supplied for stably magnetizing the selected memory cell, which corresponds to row address RA (and bank address BA) and column address CA1, in accordance with the level of write data, similarly to the third embodiment and the first and second modifications thereof.

In the column cycle #2 including instruction of the data read operation, control signal /WE is set to H-level in accordance with the activation timing of clock signal CLK. Also, column address CA2 indicating the data read target is input.

In column cycle #2, control circuit 5 activates a control signal RO to attain H-level for a predetermined period. In response to this, read data latch circuit 300 selects one storage data corresponding to received column address CA2 from the m storage data latched in the row cycle based on the results of column selection of column decoder 25, and outputs the selected data as read data DOUT.

Owing to the above structure, the data read operation in each column cycle can be performed at an increased speed because it is not necessary to detect the change in voltage on the bit line, which is caused by sense current Is passing through the selected memory cell.

In each column cycle, all read word lines RWL are inactivated to attain L-level. Therefore, even in the column cycle including instruction of the data write operation, write word line WWL can be activated in accordance with the fastest timing, and the data write operation can start fast.

According to the structure of the third modification of the third embodiment, the page mode operation already described in connection with the third embodiment and the first and second modifications can be performed further rapidly while performing the data read operation and the data write operation in a mixed manner.

The page mode operation already described in connection with the third embodiment and the first and second modifications thereof can likewise be applied to a structure, in which column select lines for reading are independent of those for writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin-film magnetic memory device comprising:
   a plurality of memory cells each having a magnetic memory portion having an electric resistance varying in accordance with a magnetization direction rewritable in response to application of a predetermined data write magnetic field caused by first and second data write currents;
   a first data write interconnection arranged in a first direction for passing said first data write current; and
   a second data write interconnection arranged in a second direction for passing said second data write current, wherein
   said first data write current is larger than said second data write current, and
   said first data write interconnection has a sectional area larger than a sectional area of said second data write interconnection.

2. The thin-film magnetic memory device according to claim 1, wherein
   said first and second data write interconnections are arranged such that a distance between said first data write interconnection and said magnetic memory portion is longer than a distance between said second data write interconnection and said magnetic memory portion.

3. The thin-film magnetic memory device according to claim 1, wherein
   said first data write interconnection has an interconnection width larger than that of said second data write interconnection.

4. The thin-film magnetic memory device according to claim 1, wherein
   said first data write interconnection has an interconnection thickness larger than that of said second data write interconnection.

5. The thin-film magnetic memory device according to claim 1, wherein
   each of said magnetic memory portions has a form having an aspect ratio larger than one between a long side and a short side,
   said first data write interconnection has an interconnection width in the direction of said long side, and
   said second data write interconnection has an interconnection width in the direction of said short side smaller than that of said first data write interconnection.

6. The thin-film magnetic memory device according to claim 5, wherein said second data write interconnection is arranged using a metal interconnection layer at a higher level than said first data write interconnection.

7. The thin-film magnetic memory device according to claim 1, wherein
said first and second data write currents are designed at predetermined levels, respectively.

8. A thin-film magnetic memory device comprising:
a plurality of memory cells each having a magnetic memory portion having an electric resistance varying in accordance with a magnetization direction rewritable in response to application of a data write magnetic field;
a first data write interconnection for passing a first data write current producing said data write magnetic field along an easy axis; and
a second data write interconnection for passing a second data write current producing said data write magnetic field along a hard axis, wherein
said first data write current has a rising time constant larger than a rising time constant of said second data write current at a start of a data write operation performed by rewriting a magnetization direction of said magnetic memory portion.

9. The thin-film magnetic memory device according to claim 8, wherein
supply of said second data write current ends earlier than ending of supply of said first data write current at the end of said data write operation.

10. The thin-film magnetic memory device according to claim 8, wherein
each of said magnetic memory portions has a form having a long side and a short side, an aspect ratio of the form being greater than unity,
said first data write interconnection is arranged along said short side, and
said second data write interconnection is arranged along said long side.

11. The thin-film magnetic memory device according to claim 8, wherein
said plurality of memory cells are arranged in rows and columns,
said first data write interconnections are arranged for memory cell columns, respectively, and
said second data write interconnections are arranged for memory cell rows, respectively;
said thin-film magnetic memory device further comprises:
plurality of column select lines arranged for said memory cell columns, respectively, and
a plurality of column select line drive portions arranged for said memory cell columns, respectively, each for driving a corresponding one of said column select lines from a first voltage to a second voltage by a predetermined operation current in a selected column; and
said predetermined operation current is set to provide said first data write current having said rising time constant larger than said rising time constant of said second data write current.

12. The thin-film magnetic memory device according to claim 11, wherein
each of said column select line drive portion includes:
a drive gate portion for driving said corresponding one of column select line by one of said first and second voltages in accordance with results of column selection, and
a drive current switching portion for supplying a first current as said predetermined operation current to said drive gate portion in said data write operation, and supplying a second current larger than said first current as said predetermined operation current to said drive gate portion in the data read operation.

13. A think-film magnetic memory device comprising:
a plurality of memory cells each having a magnetic memory portion having an electric resistance varying in accordance with a magnetization direction rewritable in response to application of a predetermined data write magnetic field caused by predetermined first and second data write currents;
a first data write interconnection arranged in a first direction for passing said predetermined first data write current; and
a second data write interconnection arranged in a second direction for passing said predetermined second data write current, wherein
said predetermined first and second data write currents are designed such that said predetermined first data write current is larger than said predetermined second data write current, and
said first and second data write interconnections are arranged such that a distance between said first data write interconnection and said magnetic memory portion is greater than a distance between said second data write interconnection and said magnetic memory portion.

14. A thin-film magnetic memory device comprising:
a plurality of memory cells each having a magnetic memory portion having an electric resistance varying in accordance with a magnetization direction rewritable in response to application of a data write magnetic field;
a first data write interconnection for passing a first data write current producing said data write magnetic field along an easy axis; and
a second data write interconnection for passing a second data write current producing said data write magnetic field along a hard axis, wherein
supply of said second data write current begins earlier than beginning of supply of said first data write at the beginning of a data write operation.

15. The thin-film magnetic memory device according to claim 14, wherein
said first data write current has a rising time constant larger than a rising time constant of said second data write current at a start of said data write operation performed by rewriting a magnetization direction of said magnetic memory portion.

16. The thin-film magnetic memory device according to claim 14, wherein
supply of said second data write current ends earlier than ending of supply of said first data write current at the end of said data write operation.

17. The thin-film magnetic memory device according to claim 14, wherein
each of said magnetic memory portions has a form having a long side and a short side, an aspect ratio of the form being greater than unity,
said first data write interconnection is arranged along said short side, and
said second data write interconnection is arranged along said long side.

18. The thin-film magnetic memory device according to claim 14, wherein
said plurality of memory cells are arranged in rows and columns,
said first data write interconnections are arranged for memory cell columns, respectively, and said second data write interconnections are arranged for memory cell rows, respectively;

said thin-film magnetic memory device further comprises:
- a plurality of column select lines arranged for said memory cell columns, respectively, and
- a plurality of column select line drive portions arranged for said memory cell columns, respectively, each for driving a corresponding one of said column select lines from a first voltage to a second voltage by a predetermined operation current in a selected column, and
- said predetermined operation current is set to provide said first data write current having said rising time constant larger than said rising time constant of said second data write current.

19. The thin-film magnetic memory device according to claim 18, wherein
- each of said column select line drive portion includes:
  - a drive gate portion for driving said corresponding one of column select line by one of said first and second voltages in accordance with results of column selection, and
  - a drive current switching portion for supplying a first current as said predetermined operation current to said drive gate portion in said data write operation, and supplying a second current larger than said first current as said predetermined operation current to said drive gate portion in the data read operation.

* * * * *

UNITED STATES PATENT AND TRADEMARK OFFICE
CERTIFICATE OF CORRECTION

PATENT NO. : 6,903,963 B2
DATED : June 7, 2005
INVENTOR(S) : Hideto Hidaka

It is certified that error appears in the above-identified patent and that said Letters Patent is hereby corrected as shown below:

Title page,
Under Item [57], change "19 Claims" to -- 22 Claims --.

Column 31,
Line 61, change "drive portion includes" to -- drive portions includes --;

Column 32,
Line 4, change "in the data read" to -- in a data read --;
Line 5, change "A think-film magnetic" to -- A thin-film magnetic --;

Column 34,
Line 3, change "drive portion includes" to -- drive portions includes --;
Line 14, after claim 19, add claims 20, 21 and 22 as shown below:

20. A thin-film magnetic memory device comprising:
    a plurality of memory cells each having a magnetic memory portion having an electric resistance varying in accordance with a magnetization direction rewritable in response to application of a predetermined data write magnetic field caused by first and second data write currents;
    a first data write interconnection arranged in a first direction for passing said first data write current; and
    a second data write interconnection arranged in a second direction for passing said second data write current, wherein
    said first data write interconnection has an interconnection width larger than that of said second data write interconnection.

UNITED STATES PATENT AND TRADEMARK OFFICE
CERTIFICATE OF CORRECTION

PATENT NO. : 6,903,963 B2
DATED : June 7, 2005
INVENTOR(S) : Hideto Hidaka

It is certified that error appears in the above-identified patent and that said Letters Patent is hereby corrected as shown below:

<u>Column 34 (cont'd),</u>
21. A thin-film magnetic memory device comprising:
    a plurality of memory cells each having a magnetic memory portion having an electric resistance varying in accordance with a magnetization direction rewritable in response to application of a predetermined data write magnetic field caused by first and second data write currents;
    a first data write interconnection arranged in a first direction for passing said first data write current; and
    a second data write interconnection arranged in a second direction for passing said second data write current, wherein
    each of said magnetic memory portions has a form having a long side and a short side, an aspect ratio of the form being greater than unity,
    said first data write interconnection is arranged along said short side, and
    said second data write interconnection is arranged along said long side.

22. The thin-film magnetic memory device according to claim 21, wherein
    said second data write interconnection is arranged using a metal interconnection layer at a higher level than said first data write interconnection.

Signed and Sealed this

Eleventh Day of October, 2005

JON W. DUDAS
*Director of the United States Patent and Trademark Office*